US012328916B2

(12) United States Patent
Frougier et al.

(10) Patent No.: US 12,328,916 B2
(45) Date of Patent: Jun. 10, 2025

(54) CPP-AGNOSTIC SOURCE-DRAIN CONTACT FORMATION FOR GATE-ALL-AROUND DEVICES WITH DIELECTRIC ISOLATION

(71) Applicant: INTERNATIONAL BUSINESS MACHINES CORPORATION, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US); Oleg Gluschenkov, Tannersville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 480 days.

(21) Appl. No.: 17/850,475

(22) Filed: Jun. 27, 2022

(65) Prior Publication Data
US 2023/0420500 A1  Dec. 28, 2023

(51) Int. Cl.
*H10D 62/10* (2025.01)
*H10D 30/43* (2025.01)
(Continued)

(52) U.S. Cl.
CPC ........... *H10D 62/116* (2025.01); *H10D 30/43* (2025.01); *H10D 30/6713* (2025.01);
(Continued)

(58) Field of Classification Search
CPC ......... H01L 29/0653; H01L 21/823418; H01L 21/823431; H01L 21/823481; H01L 29/0673; H01L 29/41733; H01L 29/42392
See application file for complete search history.

(56) References Cited

U.S. PATENT DOCUMENTS 9,484,405 B1   11/2016 Balakrishnan et al.
9,947,804 B1 *  4/2018 Frougier ............... H01L 29/165
(Continued)

FOREIGN PATENT DOCUMENTS

CN    113053823 A    6/2021

OTHER PUBLICATIONS

N-Type Nanosheet FETs without Ground Plane Region for Process Simplification, Lee, K.-S.; Park, J.-Y., Micromachines Mar. 11, 2022, 13, 432, https://doi.org/10.3390/mi13030432, Academic Editor: Chengyuan Dong.
(Continued)

*Primary Examiner* — Mamadou L Diallo
(74) *Attorney, Agent, or Firm* — Tutunjian & Bitetto; Matt Zehrer

(57) ABSTRACT

A semiconductor structure is presented including source/drain (S/D) epitaxial growth formed over a bottom dielectric isolation region, at least one first semiconductor layer disposed within the S/D epitaxial growth in a S/D region and at least one second semiconductor layer disposed partially within a gate region. The at least one second semiconductor layer extends from the gate region into a spacer region to enable a connection to the S/D epitaxial growth. The semiconductor structure further includes a first region with adjacent devices exhibiting a first Contacted gate Poly Pitch (CPP) defining a first gate-to-gate space and a second region with adjacent devices exhibiting a second CPP defining a second gate-to-gate space, where adjacent devices exhibiting the first CPP have a smaller gate-to-gate canyon than the adjacent devices exhibiting the second CPP such that the second gate-to-gate space is greater than the first gate-to-gate space.

20 Claims, 23 Drawing Sheets

(51) Int. Cl.
*H10D 30/67* (2025.01)
*H10D 84/01* (2025.01)
*H10D 84/03* (2025.01)

(52) U.S. Cl.
CPC ..... *H10D 30/6729* (2025.01); *H10D 30/6735* (2025.01); *H10D 30/6757* (2025.01); *H10D 62/121* (2025.01); *H10D 84/013* (2025.01); *H10D 84/0151* (2025.01); *H10D 84/0158* (2025.01); *H10D 84/038* (2025.01)

(56) References Cited

U.S. PATENT DOCUMENTS

| | | |
|---|---|---|
| 10,192,867 B1 | 1/2019 | Frougier et al. |
| 10,236,218 B1 | 3/2019 | Xie et al. |
| 10,276,442 B1 * | 4/2019 | Xie ................. H01L 21/823807 |
| 10,424,651 B2 * | 9/2019 | Cheng ............... H01L 29/66545 |
| 10,903,315 B2 | 1/2021 | Loubet et al. |
| 11,043,595 B2 | 6/2021 | Su et al. |
| 11,195,911 B2 * | 12/2021 | Xie ................... H01L 29/66545 |
| 2019/0341448 A1 | 11/2019 | Bourjot et al. |
| 2020/0105869 A1 | 4/2020 | Loubet et al. |
| 2020/0312956 A1 | 10/2020 | Yeh et al. |
| 2020/0373410 A1 | 11/2020 | Lee et al. |
| 2021/0193797 A1 | 6/2021 | Xie et al. |
| 2021/0249506 A1 | 8/2021 | Yeh et al. |
| 2021/0305408 A1 | 9/2021 | Yu et al. |

OTHER PUBLICATIONS

Optimization of Gate-All-Around Device to Achieve High Performance and Low Power with Low Substrate Leakage, Yoo, C.; Chang, J.; Park, S.; Kim, H.; Jeon, J., Nanomaterials Feb. 9, 2022, 12, 591, https://doi.org/10.3390/nano12040591, Academic Editors: Antonio Di Bartolomeo and Filippo Giubileo.

Integration of bottom isolated Nanosheet with long channel bulk FinFET, An IP.com Prior Art Database Technical Disclosure, Authors et al.: Disclosed Anonymously, IP.com No. IPCOM000254274D, IP.com Electronic Publication Date: Jun. 14, 2018.

Method and System for Encapsulating Fully Isolated Nanosheet-FET with PFET EPI Si:B and Optimizing TS Contact for Long-Channel devices, An IP.com Prior Art Database Technical Disclosure, Authors et. al.: Disclosed Anonymously, IP.com No. IPCOM000255718D, IP.com Electronic Publication Date: Oct. 11, 2018.

Method for Bottom Air Gap Isolation for Nano-Sheet Structures, An IP.com Prior Art Database Technical Disclosure, Authors et. al.: Disclosed Anonymously, IP.com No. IPCOM000258090D, IP.com Electronic Publication Date: Apr. 8, 2019.

Method to Fabricate Thick Bottom Dielectric with Defect-Free Channel, An IP.com Prior Art Database Technical Disclosure, Authors et. al.: Disclosed Anonymously, IP.com No. IPCOM000260890D, IP.com Electronic Publication Date: Jan. 3, 2020.

International Search Report from PCT/CN2023/083461 dated Jul. 3, 2023. (8 pages).

\* cited by examiner

CPP-AGNOSTIC SOURCE-DRAIN CONTACT FORMATION FOR GATE-ALL-AROUND DEVICES WITH DIELECTRIC ISOLATION

BACKGROUND

The present invention relates generally to semiconductor devices, and more specifically, to Contacted gate Poly-Pitch (CPP)-agnostic source/drain (S/D) contact formation for Gate-All-Around (GAA) devices with bottom dielectric isolation.

When finFETs were first commercialized at the 22 nm node, they represented a revolutionary change to the way to build transistors. Compared to prior planar transistors, the fin, contacted on three sides by the gate, provided much better control of the channel formed within the fin. However, as 5 nm and 3 nm nodes are reached, finFETs appear to have reached the end of their utility as more challenges mount when such finFETs are employed at the 5 nm and 3 nm nodes.

With every node, device manufacturers scale transistors to deliver both a performance boost and power reduction at lower device area and lower cost. However, further reduction in finFET dimensions leads to limitations or challenges in, e.g., the drive current and electrostatic control. In planar transistors, the width of the channel could be increased to drive more current and switch the transistor on and off faster. However, evolution of complementary metal oxide semiconductor (CMOS) designs to standard cells with lower track height means that there is less flexibility in fin dimensions. Single-fin devices at the sub 5 nm nodes will be unable to provide enough drive current. Also, although three sides of the fin are controlled by the gate, there still remains one side that is not controlled. As the gate length is reduced, it leads to greater short channel effects and more leakage through the uncontacted bottom of the device. As a result, smaller devices cannot meet power and performance goals.

As semiconductor integrated circuits (ICs) or chips become smaller, stacked nanosheets, which are two-dimensional nanostructures with a thickness range on the order of 1 to 100 nanometers, are increasingly used. Nanosheets and nanowires are seen as a feasible device option for 5 nm and beyond scaling of semiconductor devices. The general process flow for nanosheet formation involves removing sacrificial layers of silicon germanium (SiGe) between silicon (Si) sheets. A transistor design called Gate-All-Around, or GAA, aims to live up to Moore's law and possibly continue the advancement in transistor-level semiconductor space.

GAA transistors are a modified transistor structure where the gate contacts the channel from all sides and enables continued scaling. Early GAA devices use vertically-stacked nanosheets. They are constructed of separate horizontal sheets, surrounded by gate materials on all sides. This provides improved channel control relative to finFETs. Unlike finFETs, where higher current requires multiple side-by-side fins, the current-carrying capacity of GAA transistors is increased by stacking a few nanosheets vertically, with gate material wrapped around the channels. The nanosheet dimensions can be scaled so that transistors can be sized for the specific performance required. However, as with fins, the width and spacing of the nanosheets will drop as the technology scales and as the ability to print finer features continues to improve.

Therefore, GAA provides a rework of the traditional transistor design where gate material surrounds the silicon semiconductor channel on four sides instead of being covered by the gate from three sides (e.g., FinFET devices). The primary benefits of the GAA transistor design are reduction in design size and increased potential for channel length scaling, which provides for increased transistor density. GAA transistors thus appear to be the successors of finFETs.

SUMMARY

In accordance with an embodiment, a semiconductor structure is provided. The semiconductor structure includes source/drain (S/D) epitaxial growth formed over a bottom dielectric isolation (BDI) region, at least one first semiconductor layer disposed within the S/D epitaxial growth in a S/D region, the at least one first semiconductor layer being an inactive channel, at least one second semiconductor layer disposed partially within a gate region, the at least one second semiconductor layer being an active channel, and where the at least one second semiconductor layer extends from a gate region into a spacer region to enable a connection to the S/D epitaxial growth, a first region with adjacent devices exhibiting a first Contacted gate Poly Pitch (CPP) defining a first gate-to-gate space, and a second region with adjacent devices exhibiting a second CPP defining a second gate-to-gate space, where adjacent devices exhibiting the first CPP advantageously have a smaller gate-to-gate canyon than the adjacent devices exhibiting the second CPP such that the second gate-to-gate space is greater than the first gate-to-gate space. The benefits of such structural configuration include at least enabling a reliable land trench metal contact on merged epi in large canyon spaces, as well as a significant improvement of the Si surface available for S/D epi nucleation.

In accordance with another embodiment, a semiconductor structure is provided. The semiconductor structure includes a bottom dielectric isolation (BDI) region disposed in direct contact with a substrate, source/drain (S/D) epitaxial growth including vertical portions disposed over the BDI region, at least one first semiconductor layer disposed within the S/D epitaxial growth in a S/D region, at least one second semiconductor layer disposed partially within a gate region, where the at least one second semiconductor layer extends from a gate region into a spacer region to enable a connection to the S/D epitaxial growth, a first region with adjacent devices exhibiting a first Contacted gate Poly Pitch (CPP) defining a first gate-to-gate space, and a second region with adjacent devices exhibiting a second CPP defining a second gate-to-gate space, where adjacent devices exhibiting the first CPP advantageously have a smaller gate-to-gate canyon than the adjacent devices exhibiting the second CPP such that the second gate-to-gate space is greater than the first gate-to-gate space. The benefits of such structural configuration include at least enabling a reliable land trench metal contact on merged epi in large canyon spaces, as well as a significant improvement of the Si surface available for S/D epi nucleation.

In accordance with yet another embodiment, a method is provided. The method includes forming fins over a substrate, the fins including alternating layers of a first semiconductor material and a second semiconductor material, forming sacrificial gates, forming a sacrificial dielectric over the fins in a gate region, constructing a bottom dielectric isolation (BDI) region directly between the fins and the substrate, forming a first spacer, depositing an interlayer dielectric (ILD) in a source/drain (S/D) region, selectively etching the first spacer, recessing the fins and forming inner spacers, forming source/drain (S/D) epitaxial growth, forming a second spacer over and in direct contact with the S/D epitaxial growth, etching the first semiconductor material of the fins in the S/D region and selectively removing the inner spacers formed in the S/D region, selectively etching the second spacer to expose a top surface of the S/D epitaxial growth, and forming cladded S/D epitaxy in the S/D region such that the cladded S/D epitaxy surrounds the second semiconductor material of the fins. The benefit of such method includes at least the enablement to simulate a constant canyon space design for any CPP and any gate length by using simple spacers to provide for a cheap and optimal solution to prevent bottom dielectric isolation punch-through during S/D recess.

In one preferred aspect, a center axis of the at least one first semiconductor layer in the S/D region is horizontally aligned with a center axis of the at least one second semiconductor layer extending from the gate region to the spacer region.

In another preferred aspect, the at least one first semiconductor layer is composed of a same material as the at least one second semiconductor layer.

In yet another preferred aspect, the S/D epitaxial growth defines vertical portions extending from the BDI region to above a top surface of the at least one first semiconductor layer and the at least one second semiconductor layer.

In one preferred aspect, the vertical portions of the S/D epitaxial growth connect the at least one first semiconductor layer of the S/D region to the at least one second semiconductor layer extending from the gate region to the spacer region.

In another preferred aspect, the S/D epitaxial growth completely surrounds the at least one first semiconductor layer.

In yet another preferred aspect, the adjacent devices in the first region exhibiting the first CPP have the S/D region without the at least one first semiconductor layer disposed within a S/D; and the adjacent devices in the second region exhibiting the second CPP have the S/D region with the at least one second semiconductor layer disposed within the S/D.

In yet another preferred aspect, metal contacts extend below a top surface of vertical portions defined by the S/D epitaxial growth.

The advantages of the present invention include producing transistors that consume less power, have better performance, occupy less area on a wafer, and reduce cost in semiconductor manufacturing. The main construction challenges of GAA devices arise as a result of the complex structures being built. The GAA transistors are fabricated by first growing a superlattice of alternating SiGe and Si epitaxial layers, which form the basis for the nanosheets. Main steps include, but are not limited to, deposition of an inner dielectric spacer to protect the S/D regions and define the gate width, as well as the channel release etch to remove the sacrificial layers. That space left by the removal of the sacrificial layers then needs to be filled with the gate dielectric and metal, including between the nanosheets. New materials are being introduced for the gate metal and new construction steps are constantly evolving. Moreover, further challenges include bottom dielectric punch-through in the variable gate-to-gate canyon space and contact landing on unmerged epi in the wide PC-PC canyons. For instance, if there is a large pitch device that benefits or requires BDI under the S/D, then a (100) template would be needed somewhere in the S/D region to be able to fill a large S/D cavity.

The exemplary embodiments of the present invention address such challenges by advantageously enabling to simulate a constant canyon space design for any CPP and any gate length by using simple spacers. This is useful because it provides for a cheap and optimal solution to prevent bottom dielectric isolation punch-through during S/D recess.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
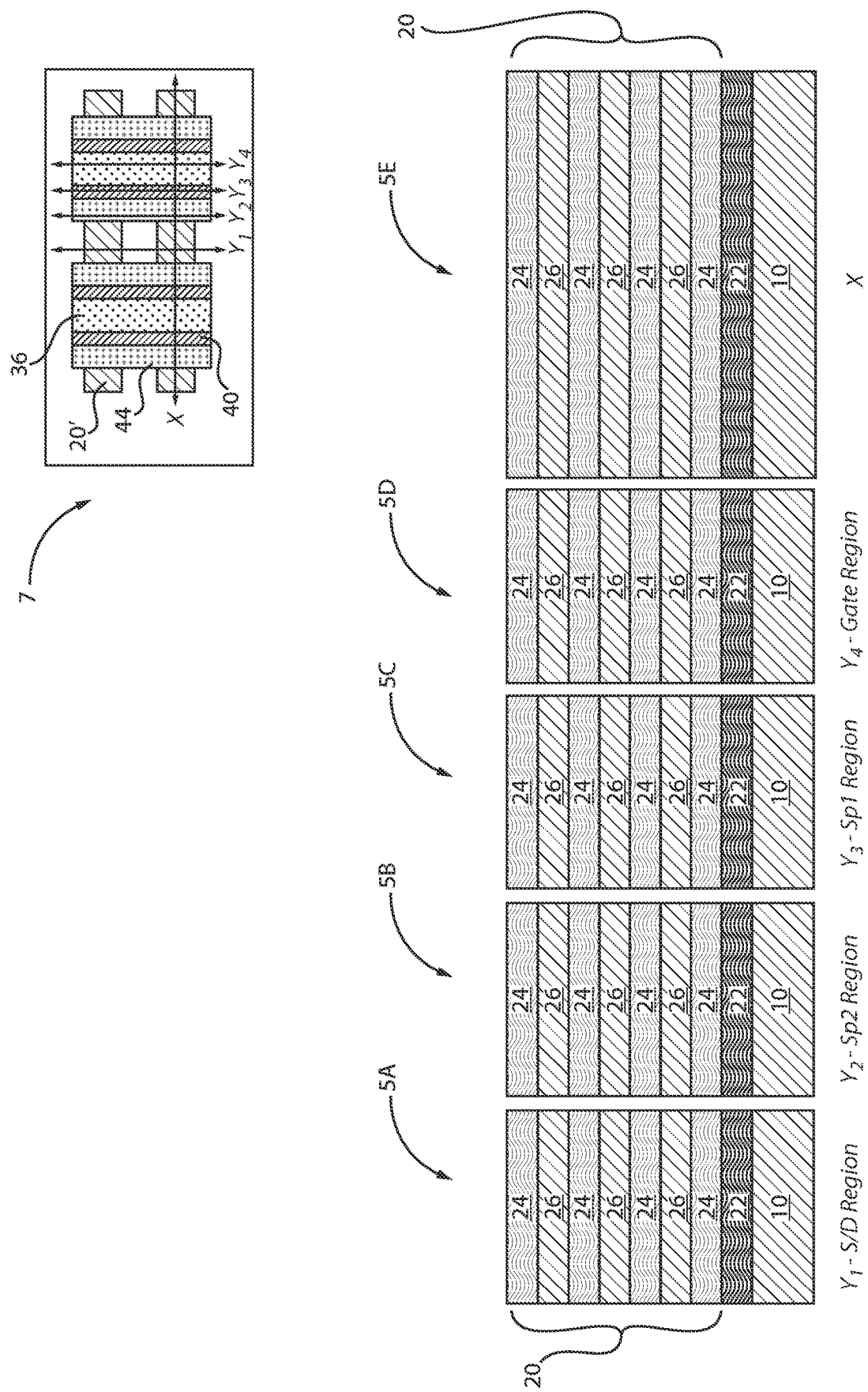
FIG. 1 is a cross-sectional view of a semiconductor structure including a nanosheet stack formed over a substrate, in accordance with an embodiment of the present invention.

Embodiments in accordance with the present invention provide methods and devices for advantageously achieving Contacted gate Poly Pitch (CPP)-agnostic sourced/drain (S/D) contact formation for Gate-All-Around (GAA) devices with bottom dielectric isolation including stacked mandrels in the S/D region, which are horizontally aligned with the stacked channels in the gate region. The stacked mandrels in the S/D region and the stacked channels in the gate region may be beneficially composed of the same material. Full bottom dielectric isolation in the gate region and S/D region is advantageously achieved, and a vertical S/D epitaxy extending from the bottom dielectric isolation to above the top-most mandrel and connecting the stacked mandrels in the S/D region and the stacked channels in the gate region are presented as beneficial improvements. A cladded S/D epitaxy around the stacked mandrels in the S/D regions is further advantageously achieved to connect the vertical S/D epitaxy in between the stacked mandrels in the S/D region and the stacked channels in the gate region.

Moreover, the exemplary embodiments of the present invention provide for an improvement of the silicon (Si) surface available for S/D epi nucleation. In other words, the uncut sheets (of Si) in the S/D region advantageously allow to nucleate large volumes of crystalline epi. Moreover, the exemplary embodiments of the present invention advantageously enable to reliably land trench metal contacts on merged epi in large gate canyon spaces. In wide canyons with the substrate covered by bottom dielectric isolation (BDI) or a BOX (SOI case), the S/D epitaxy cannot nucleate in the center of the canyons since the substrate is not exposed. This leads to epitaxy forming only on the sidewalls of the adjacent device which can make it impossible to land a trench contact on the S/D epi. Adding these Si mandrels in the S/D region above the BDI or BOX (SOI case) advantageously enables to ensure a nucleation point in the wide gate-to-gate space for a merged S/D epitaxy to be formed. The exemplary methods of the present invention further advantageously enable to simulate a constant canyon space design for any CPP and any gate length by using simple spacers. This provides for an improvement in preventing bottom dielectric isolation punch-through during the S/D recess, which is beneficial in GAA semiconductor processing.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a nanosheet stack formed over a substrate, in accordance with an embodiment of the present invention.

In various example embodiments, a nanosheet stack 20 is formed over a substrate 10.

In particular, in structure 5A, in the source/drain (S/D) region, a sacrificial layer 22 is formed over the substrate 10. The sacrificial layer 22 includes silicon germanium (SiGe) with a Ge concentration ranging from about 40% to about 75%. The nanosheet stack 20 is formed over the sacrificial layer 22, where the nanosheet stack 20 includes alternating layers of a first semiconductor material (or layer) 24 and a second semiconductor material (or layer) 26. The first semiconductor material 24 can be, e.g., silicon germanium (SiGe) with a Ge concentration ranging from about 15% to about 50% and the second semiconductor material 26 can be, e.g., silicon (Si). The first semiconductor layer 24 and the second semiconductor layer 26 can be referred to as mandrels or channels. It is noted that the "stack" can include one or more layers or channels or at least one layer or channel.

Structure 5A is a cross-section along axis $Y_1$ as shown in the top view 7.

Structure 5B illustrates the same structure as in structure 5A in the second spacer region and is a cross-section along axis $Y_2$ as shown in the top view 7.

Structure 5C illustrates the same structure as in structure 5A in the first spacer region and is a cross-section along axis $Y_3$ as shown in the top view 7.

Structure 5D illustrates the same structure as in structure 5A in the gate region and is a cross-section along axis $Y_4$ as shown in the top view 7.

Structure 5E illustrates the same structure as in structure 5A and is a cross-section along axis X extending horizontally over the first spacer 40, the second spacer 44, and the sacrificial material 36 as shown in the top view 7.

The top view 7 illustrates the spatial relationship between the first spacer 40, the second spacer 44, the sacrificial material 36, and the fins 20'.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Referring to, e.g., nanosheet stack 20, the first semiconductor material 24 can be the first layer in a stack of sheets of alternating materials. The nanosheet stack 20 thus includes first semiconductor materials (or layers) 24 and second semiconductor materials (or layers) 26. Although it is specifically contemplated that the first semiconductor materials 24 can be formed from silicon germanium and that the second semiconductor materials 26 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor materials 24/26 can be deposited by any appropriate mechanism. It is specifically contemplated that the semiconductor materials 24/26 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

Figure 2:
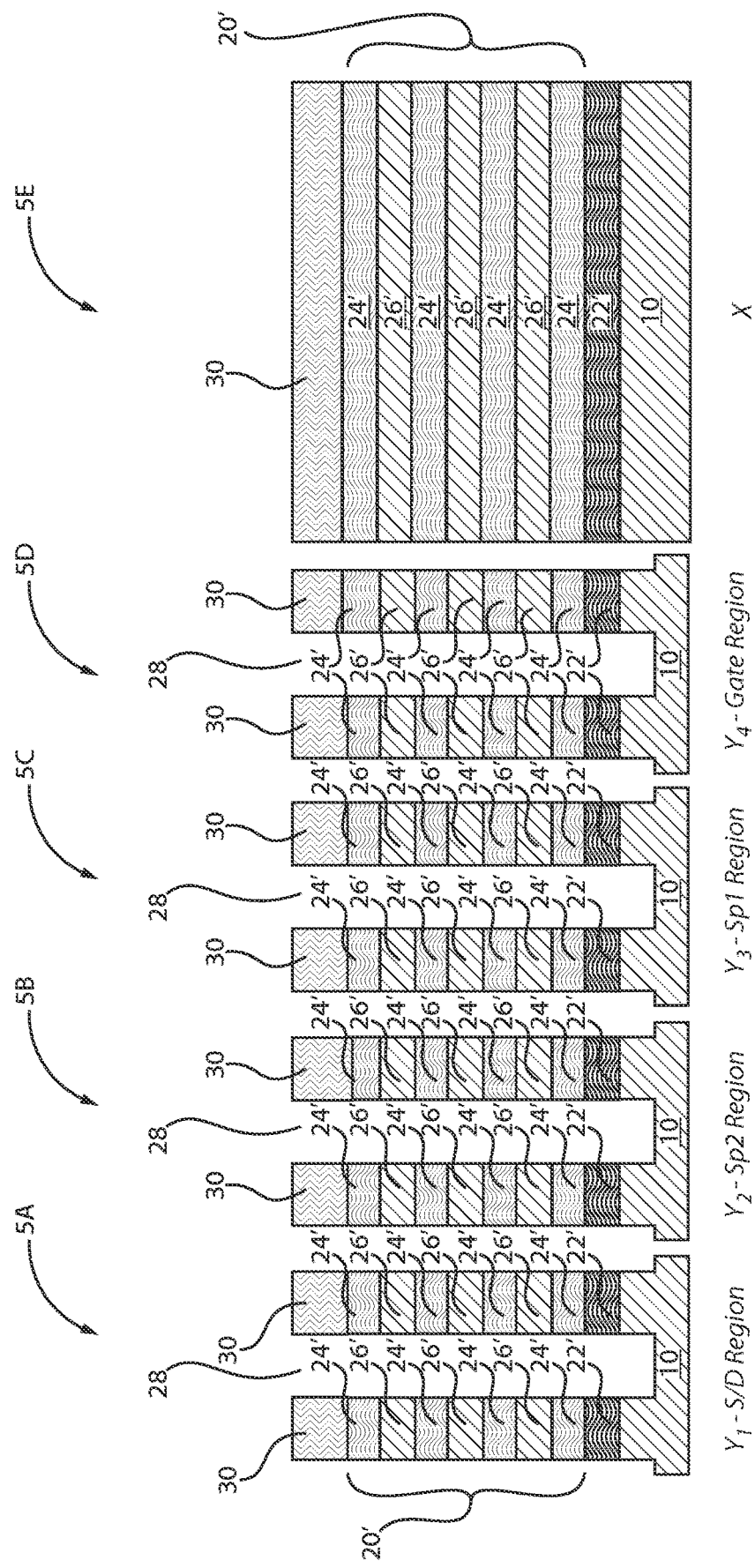
FIG. 2 is a cross-sectional view of the semiconductor structure of FIG. 1 where a hardmask is deposited and fins are formed, in accordance with an embodiment of the present invention.

FIG. 2 is a cross-sectional view of the semiconductor structure of FIG. 1 where a hardmask is deposited and fins are formed, in accordance with an embodiment of the present invention.

In various example embodiments, a hardmask 30 is deposited and the fins 20' are formed by selectively etching the nanosheet stack 20. A space 28 is defined between the fins 20'. The etching also affects the sacrificial layer 22 and the substrate 10. In particular, the etching results in recessed sacrificial layer 22' formed between the substrate 10 and the fins 20'. The etching also results in recessing of the substrate 10 within spaces 28 defined between the fins 20'. The recessed regions can also be referred to as trenches. The fins 20' are visible in the S/D region, the second spacer region, the first spacer region, and the gate region. The fins 20' include alternating semiconductor layers 24'/26'.

The hardmask 30 can be, e.g., a hardmask including nitride. The hardmask 30 can include any of one or more of SiO, SiN, SiCN, SiBN and/or SiBCN, among other materials. The hardmask 30 can be an oxide, for example, a silicon oxide hardmask. The hardmask 30 can be patterned by any suitable patterning techniques, including but not limited to, lithography followed by etching, sidewall image transfer (SIT), direct patterning, self-aligned double patterning (SADP), self-aligned multiple patterning (SAMP), self-aligned quadruple patterning (SAQP), or any suitable combination of those techniques.

Any etching technique known in the art can be used for the recessing.

Figure 3:
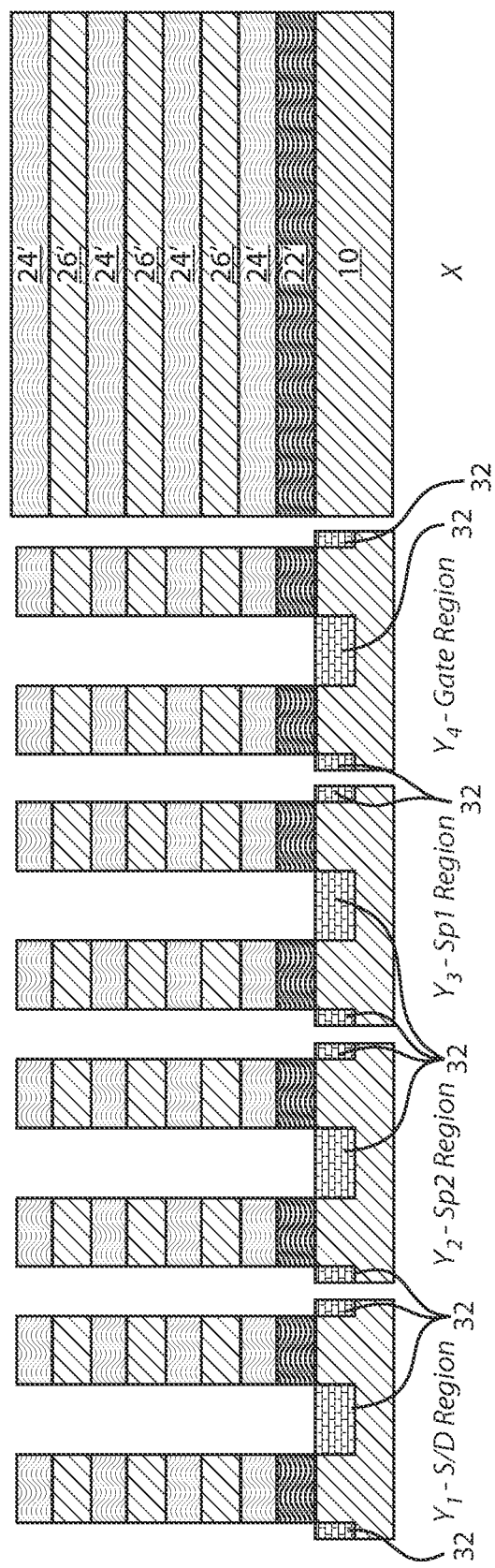
FIG. 3 is a cross-sectional view of the semiconductor structure of FIG. 2 where shallow trench isolation (STI) regions are formed and the hardmask is removed, in accordance with an embodiment of the present invention.

FIG. 3 is a cross-sectional view of the semiconductor structure of FIG. 2 where shallow trench isolation (STI) regions are formed and the hardmask is removed, in accordance with an embodiment of the present invention.

In various example embodiments, STI regions 32 are formed over the substrate 10. The STI regions 32 rest within the recessed portions or trenches of the substrate 10. The hardmask 30 is then selectively removed. Formation of the STI regions 32 can include FCVD oxide deposition, chemical mechanical polishing (CMP) stopping on the fin hardmask, selective recess of STI oxide to a desired height, and fin hardmask strip.

Figure 4:
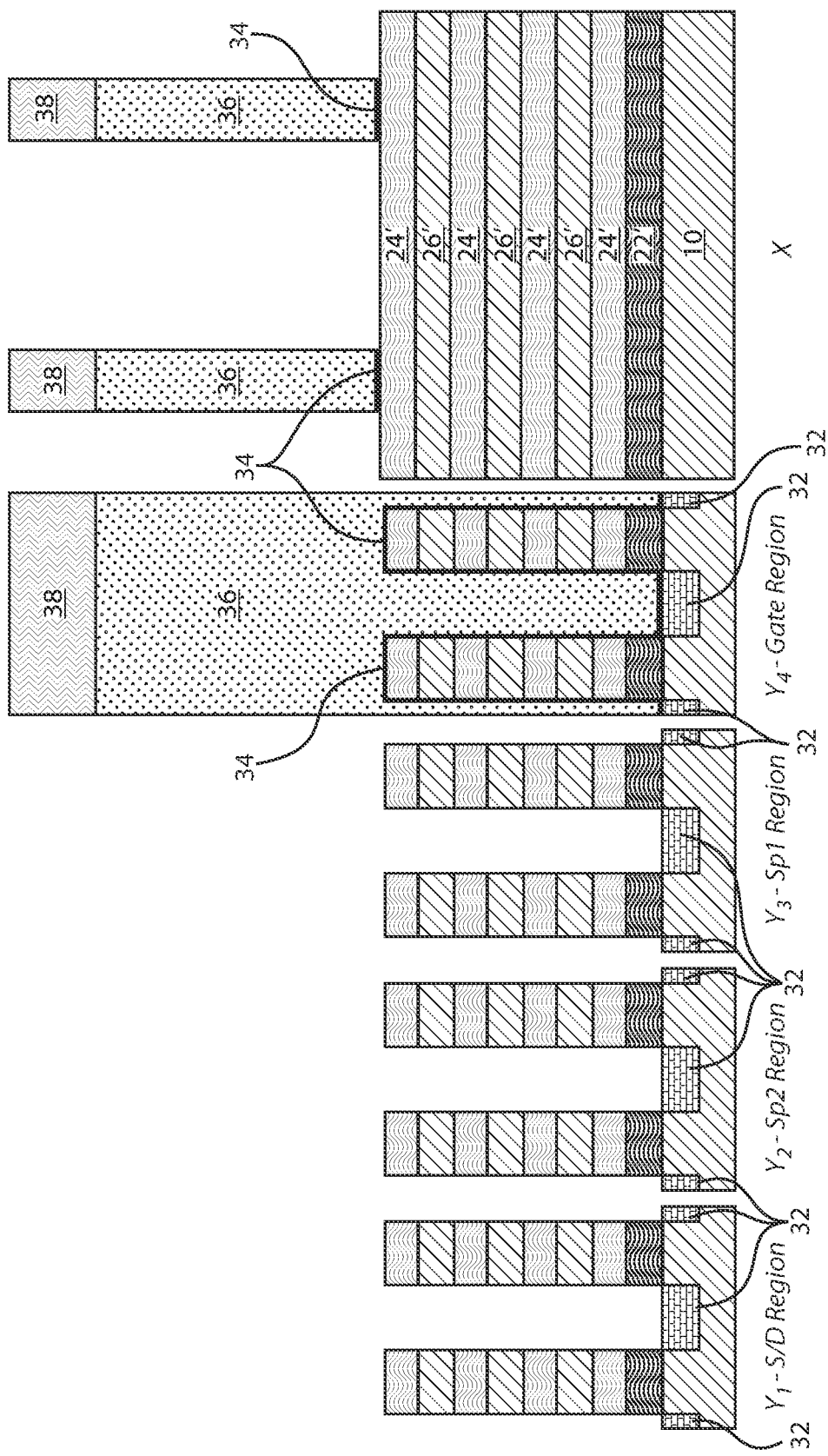
FIG. 4 is a cross-sectional view of the semiconductor structure of FIG. 3 where dummy oxide is deposited and dummy gates are formed including a sacrificial material and a hardmask, and dummy gate patterning and dummy gate etch are performed, in accordance with an embodiment of the present invention.

FIG. 4 is a cross-sectional view of the semiconductor structure of FIG. 3 where dummy oxide is deposited and dummy gates are formed including a sacrificial material and a hardmask, and dummy gate patterning and dummy gate etch are performed, in accordance with an embodiment of the present invention.

In various example embodiments, a dielectric liner 34, a sacrificial material 36, and a hardmask 38 are formed in the gate region. The dielectric liner 34 envelops or encapsulates the fins 20'. The sacrificial material 36 is formed over the fins 20' in the gate region.

The dielectric liner 34 can be, e.g., an oxide layer.

The sacrificial material 36 can be, e.g., amorphous silicon (a-Si).

The hardmask 38 can be, e.g., a hardmask including nitride. The hardmask 38 can include any of one or more of SiO, SiN, SiCN, SiBN and/or SiBCN, among other materials. The hardmask 38 can be an oxide, for example, a silicon oxide hardmask. The hardmask 38 can be patterned by any suitable patterning techniques, including but not limited to, lithography followed by etching, direct patterning, self-aligned double patterning (SADP), self-aligned multiple patterning (SAMP), self-aligned quadruple patterning (SAQP), or any suitable combination of those techniques.

The liner 34, the sacrificial material 36, and the hardmask 38 are also visible in the cross-sectional view along the X-direction.

Figure 5:
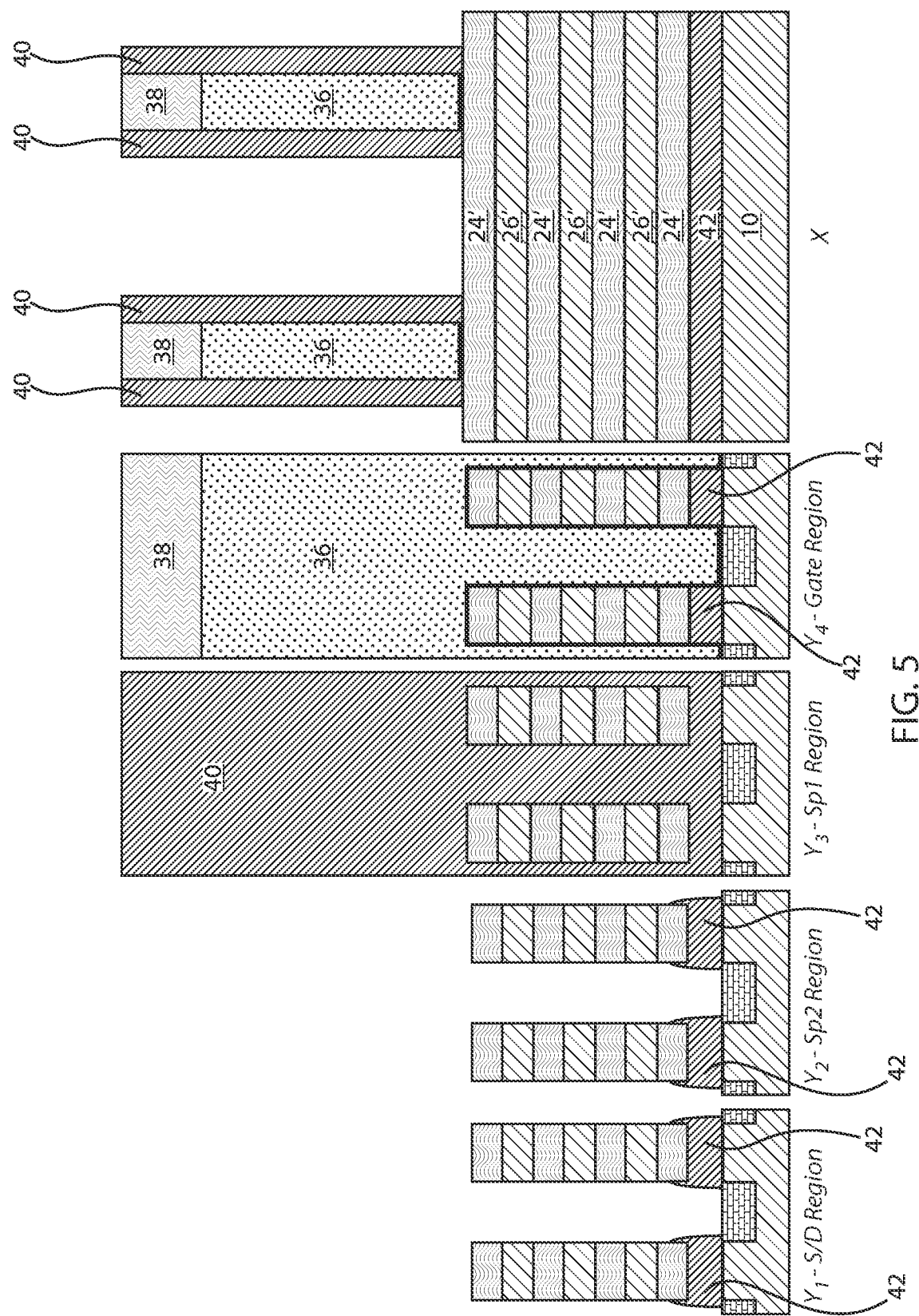
FIG. 5 is a cross-sectional view of the semiconductor structure of FIG. 4 where a sacrificial layer of the nanosheet stack is removed, a first spacer is selectively deposited to form a bottom dielectric isolation (BDI) layer adjacent the substrate, and gate spacers are formed along with the BDI layer, in accordance with an embodiment of the present invention.

FIG. 5 is a cross-sectional view of the semiconductor structure of FIG. 4 where a sacrificial layer of the nanosheet stack is removed, a first spacer is selectively deposited to form a bottom dielectric isolation (BDI) layer adjacent the substrate, and gate spacers are formed along with the BDI layer, in accordance with an embodiment of the present invention.

In various example embodiments, a first spacer 40 is deposited and bottom dielectric isolation (BDI) regions 42 are formed by replacing the recessed sacrificial layer 22' positioned between the substrate 10 and the fins 20'. In the first spacer region, the first spacer 40 envelops or surrounds the fins 20' and the dummy gates. The first spacers 40 are also formed on opposed ends of the sacrificial material 36 in the cross-sectional view along the X-direction. The BDI regions 42 are formed directly between the substrate 10 and the fins 20'. The BDI regions 42 can be composed of the same material as the first spacer 40.

The first spacer 40 and the BDI regions 42 can include any of one or more of SiN, SiBN, SiCN, SiBCN, SiO, SiOC, SiON and/or SiOCN films.

Figure 6:
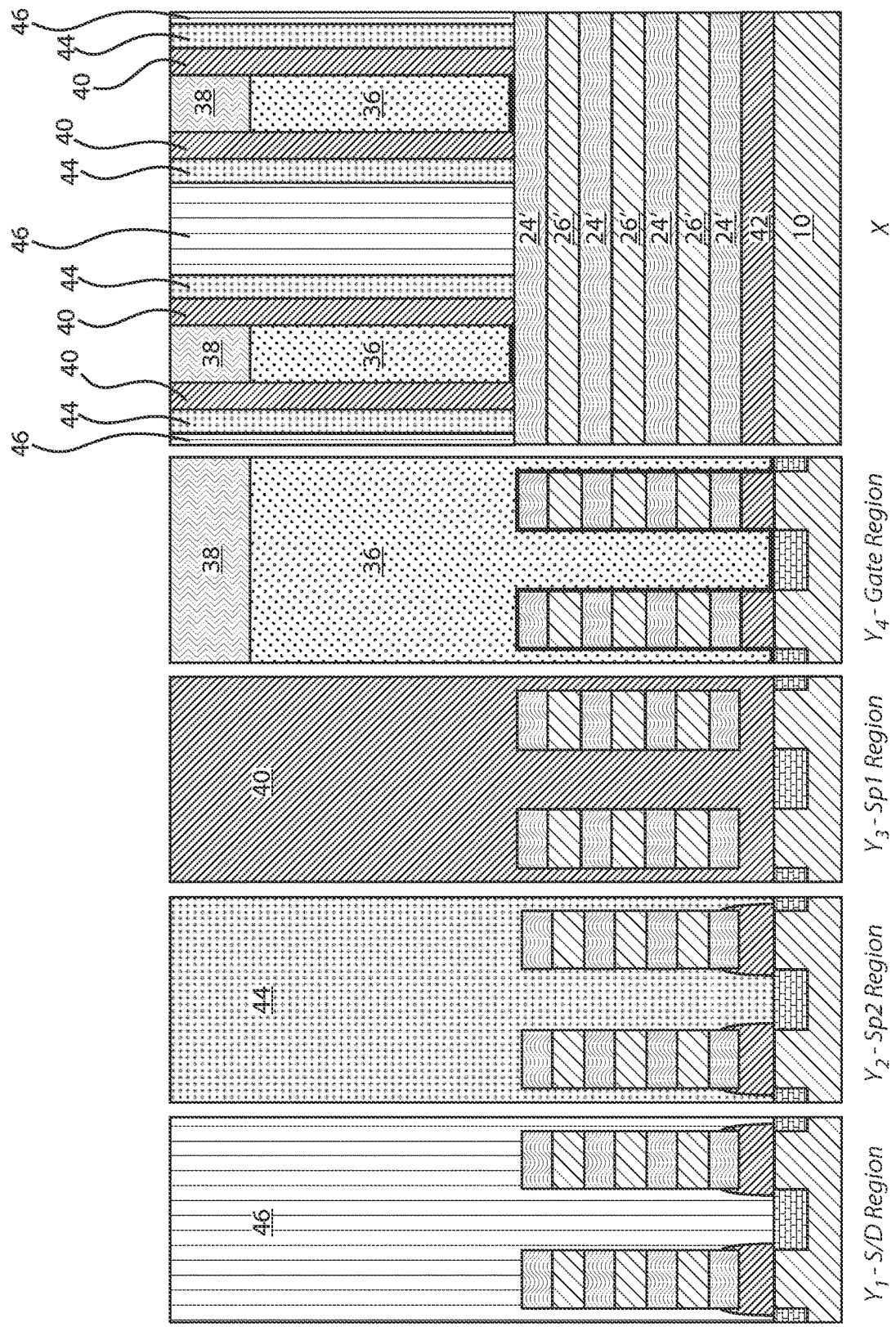
FIG. 6 is a cross-sectional view of the semiconductor structure of FIG. 5 where a second spacer is selectively deposited and an interlayer dielectric (ILD) is deposited over the source/drain (S/D) region, in accordance with an embodiment of the present invention.

FIG. 6 is a cross-sectional view of the semiconductor structure of FIG. 5 where a second spacer is selectively deposited and an interlayer dielectric (ILD) is deposited over the source/drain (S/D) region, in accordance with an embodiment of the present invention.

In various example embodiments, a second spacer 44 is selectively deposited in the second spacer region and an interlayer dielectric (ILD) 46 is deposited over the fins 20' in the source/drain (S/D) region. In the X-direction, the second spacer 44 is formed adjacent to the first spacer 40 such that the second spacers 44 directly contact the first spacers 40. Further, in the X-direction, the ILD 46 directly contacts the second spacers 44. Planarization is performed, such as, e.g., chemical-mechanical polishing (CMP) to planarize the top surfaces of the first spacers 40, the second spacers 44, and the ILD 46.

The second spacers 44 can be, e.g., titanium oxide (TiOx).

The ILD 46 can be any suitable material, such as, for example, porous silicates, carbon doped oxides, silicon dioxides, silicon nitrides, silicon oxynitrides, or other dielectric materials. Any known manner of forming the ILD 46 can be utilized. The ILD 46 can be formed using, for example, CVD, PECVD, ALD, flowable CVD, spin-on dielectrics, or PVD.

Figure 7:
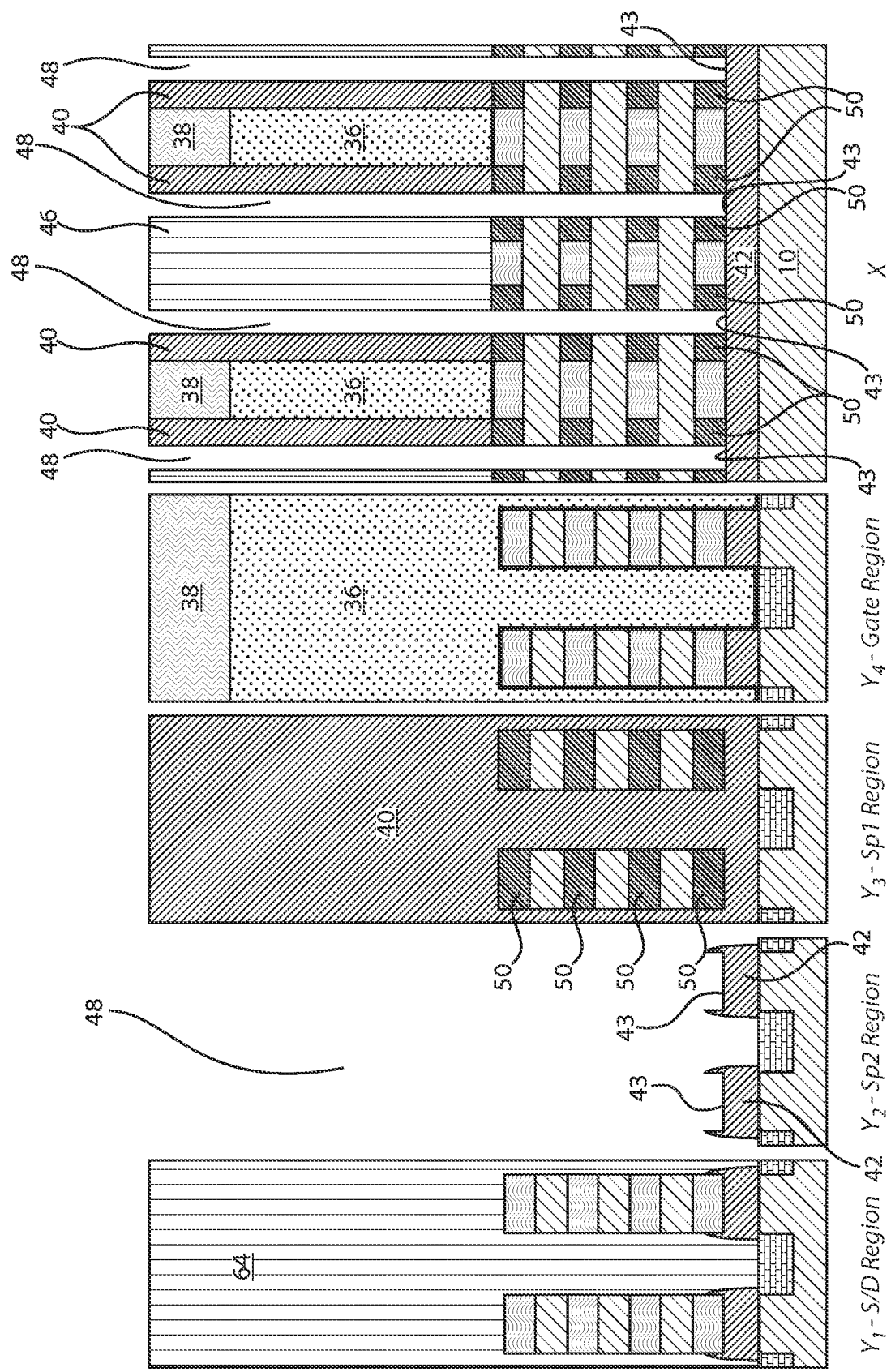
FIG. 7 is a cross-sectional view of the semiconductor structure of FIG. 6 where the second spacer is selectively removed, the fins are recessed, and inner spacers are formed, in accordance with an embodiment of the present invention.

FIG. 7 is a cross-sectional view of the semiconductor structure of FIG. 6 where the second spacer is selectively removed, the fins are recessed, and inner spacers are formed, in accordance with an embodiment of the present invention.

In various example embodiments, the second spacers 44 are selectively removed, exposed fins 20' are recessed, and inner spacers 50 are formed. The selective removal of the second spacers 44 results in openings 48. In the second spacer region, a top surface 43 of the BDI regions 42 is exposed. In the first spacer region, the inner spacers 50 are visible. The S/D region and the gate region views remain the same. In the X-direction, the top surface 43 of the BDI regions 42 is exposed within the openings 48.

The inner spacers 50 can include any of one or more of SiN, SiBN, SiCN, SiBCN, SiO, SiOC, SiON and/or SiOCN films.

The etching can include a dry etching process such as, for example, reactive ion etching, plasma etching, ion beam etching or laser ablation. The etching can further include a wet chemical etching process in which one or more chemical etchants are used to remove portions of the blanket layers that are not protected by the patterned photoresist.

In some examples, the selective wet etch or the selective dry etch can selectively remove the portions of first semiconductor material 24 (e.g., the SiGe layer) and leave the entirety or portions of the second semiconductor material 26. The removal creates gaps or openings or indentations between the second semiconductor materials 26.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 8:
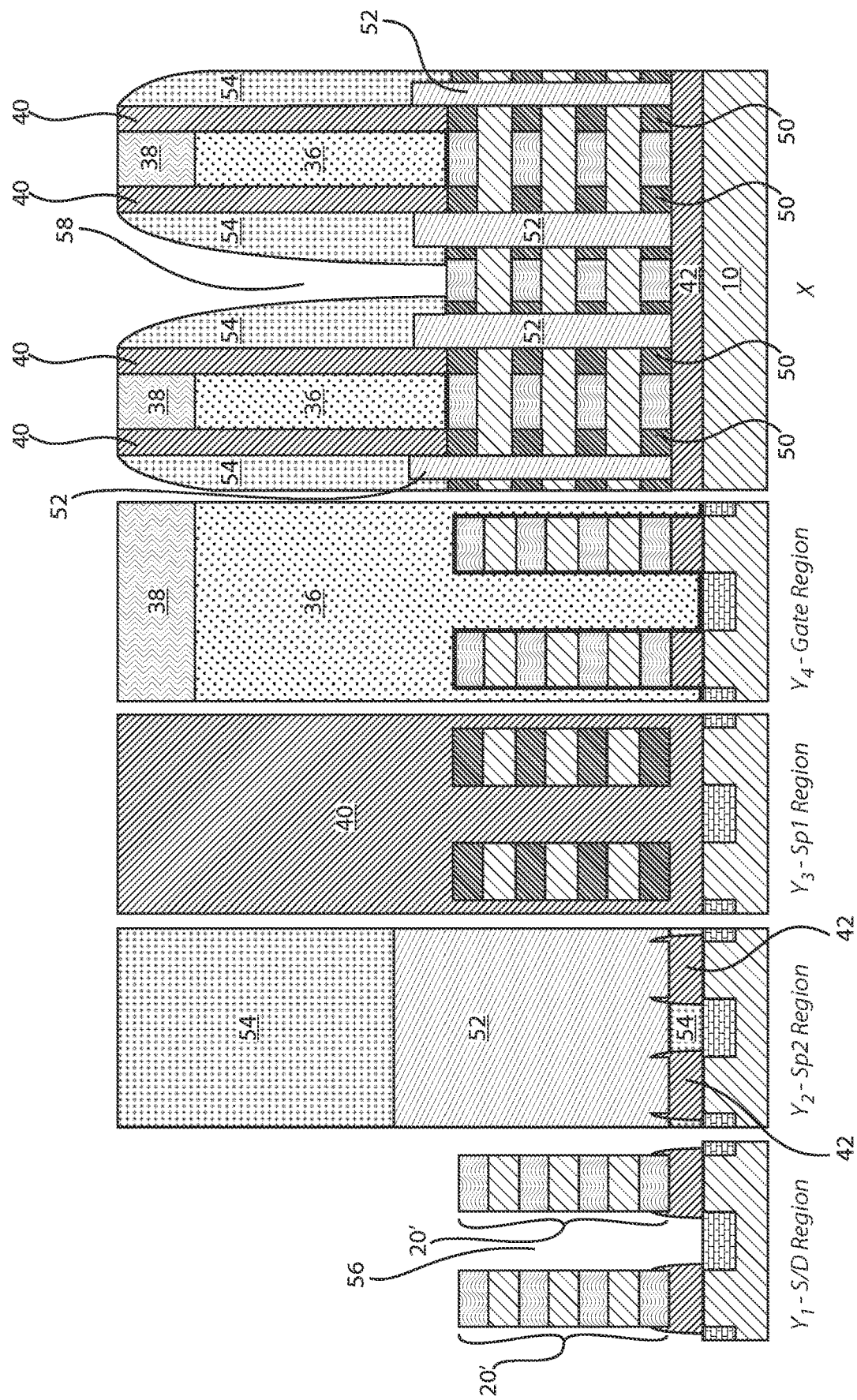
FIG. 8 is a cross-sectional view of the semiconductor structure of FIG. 7 where S/D epitaxial growth is performed, the ILD is removed, and a third spacer is deposited over the S/D epitaxial growth, in accordance with an embodiment of the present invention.

FIG. 8 is a cross-sectional view of the semiconductor structure of FIG. 7 where S/D epitaxial growth is performed, the ILD is removed, and a third spacer is deposited over the S/D epitaxial growth, in accordance with an embodiment of the present invention.

In various example embodiments, a S/D epitaxial growth 52 is first performed. The S/D epitaxial growth 52 is visible in the second spacer region and in the X-direction. Then, the ILD 46 is removed and a third spacer 54 is deposited. The third spacer 54 is formed directly over the S/D epitaxial growth 52. The third spacer 54 is only visible in the second spacer region and the X-direction.

In the second spacer region, the S/D epitaxial growth 52 directly contacts the BDI regions 42. In the X-direction, the S/D epitaxial growth 52 directly contacts sidewalls of the inner spacers 50. In fact, the S/D epitaxial growth 52 extends vertically to directly contact a portion of sidewalls of the first spacers 40. Thus, the S/D epitaxial growth 52 defines vertical portions or sections.

In the S/D region, the fins 20' are exposed such that an opening 56 is defined therebetween. Additionally, in the X-direction, an opening 58 is defined separating the third spacers 54 being formed around the sacrificial materials 36.

The third spacer 54 can be, e.g., titanium oxide (TiOx).

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 9:
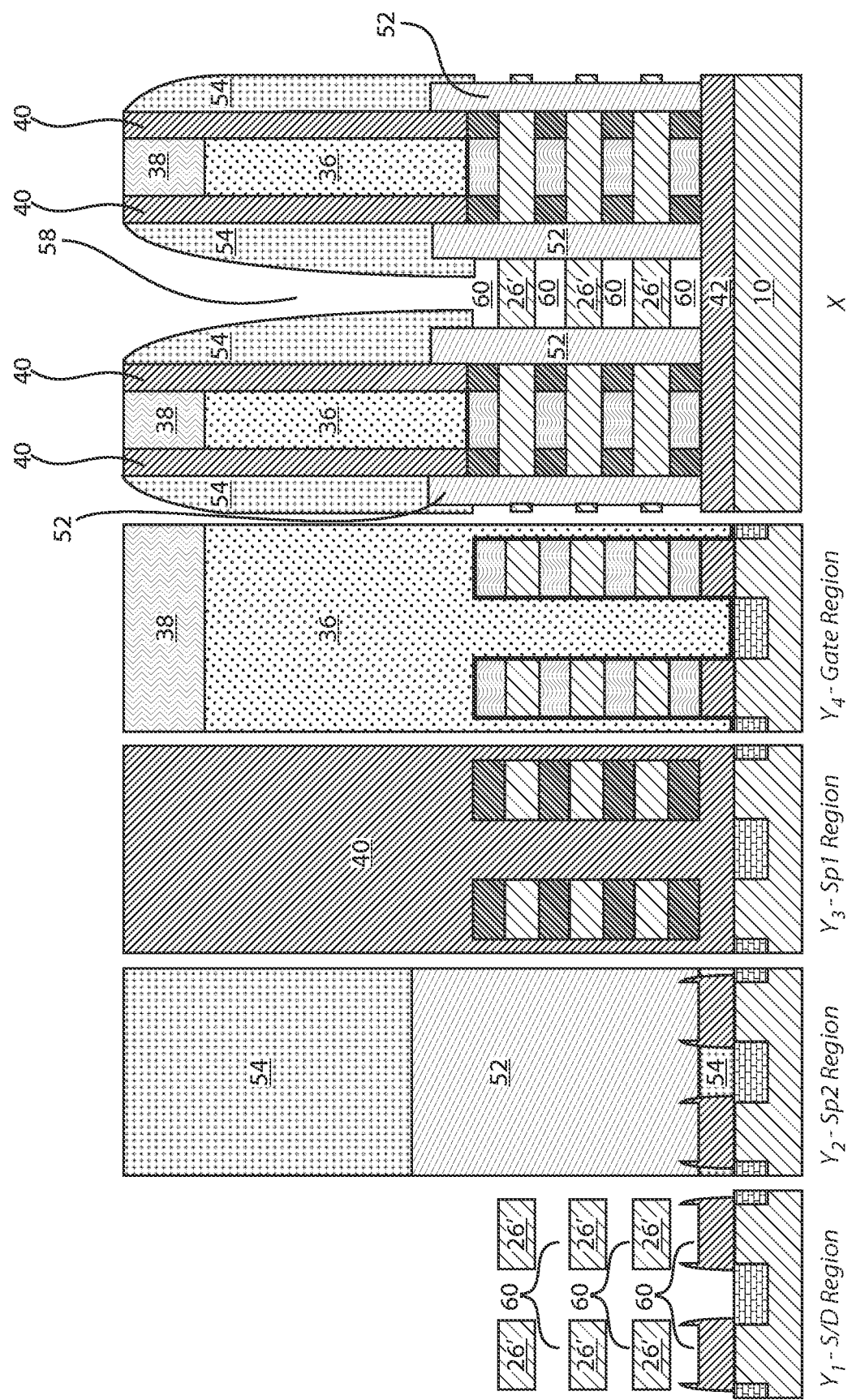
FIG. 9 is a cross-sectional view of the semiconductor structure of FIG. 8 where the remaining sacrificial layers of the fins are removed to create gaps between the semiconductor layers of the fins, and where inner spacers are also removed after selectively removing the sacrificial material, in accordance with an embodiment of the present invention.

FIG. 9 is a cross-sectional view of the semiconductor structure of FIG. 8 where the remaining sacrificial layers of the fins are removed to create gaps between the semiconductor layers of the fins, and where inner spacers are also removed after selectively removing the sacrificial material, in accordance with an embodiment of the present invention.

In various example embodiments, the remaining sacrificial layers of the fins 20' are removed to create gaps 60 between the semiconductor materials 26' of the fins 20'. This is clearly shown in the S/D region and the X-direction. In the X-direction, the inner spacers 50 are also etched back.

Figure 10:
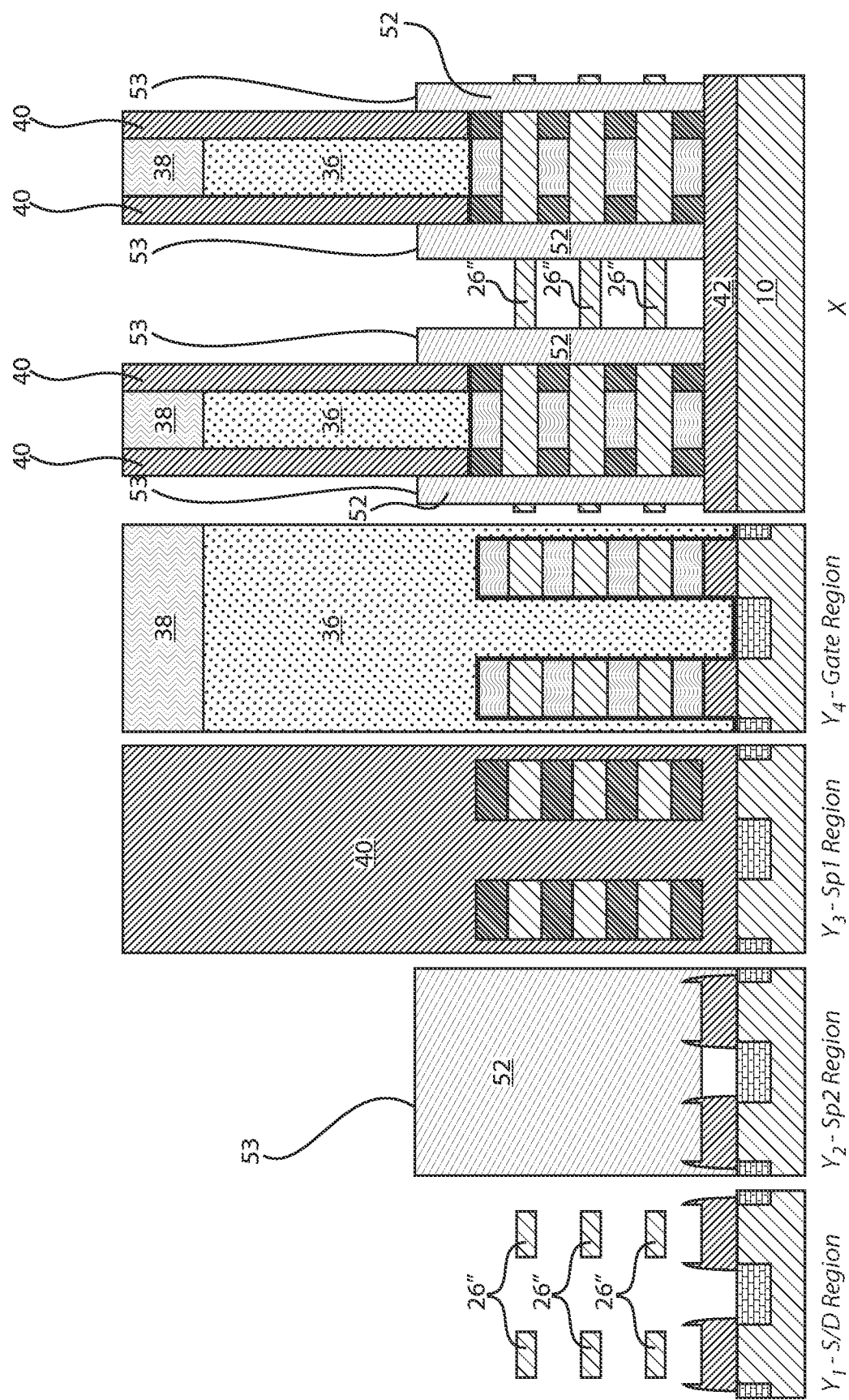
FIG. 10 is a cross-sectional view of the semiconductor structure of FIG. 9 where the semiconductor layers of the nanosheet stack are optionally thinned and the third spacers are selectively removed, in accordance with an embodiment of the present invention.

FIG. 10 is a cross-sectional view of the semiconductor structure of FIG. 9 where the semiconductor layers of the nanosheet stack are optionally thinned and the third spacers are selectively removed, in accordance with an embodiment of the present invention.

In various example embodiments, the semiconductor materials 26' of the nanosheet stack are optionally thinned to create thinned semiconductor materials 26" and the third spacers 54 are selectively removed to expose the S/D epitaxial growths 52. A top surface 53 of the S/D epitaxial growths 52, as well as sidewalls of the S/D epitaxial growths 52 are exposed. The S/D epitaxial growths 52 are visible in the second spacer region and the X-direction. The thinned semiconductor materials 26" can also be referred to as first stacked semiconductor layers 26".

Figure 11:
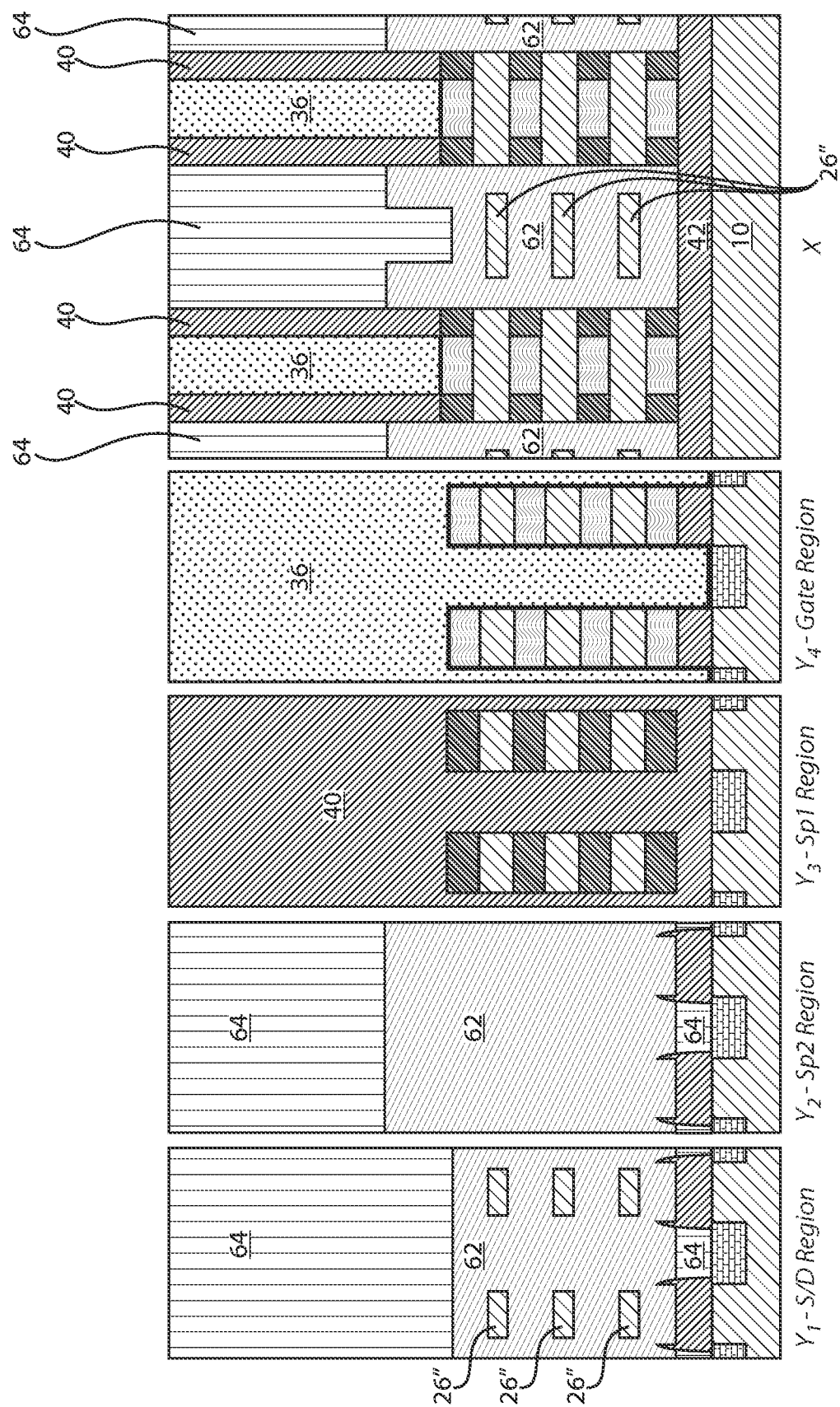
FIG. 11 is a cross-sectional view of the semiconductor structure of FIG. 10 where additional S/D epitaxial growth takes place around the thinned semiconductor layers, an ILD is deposited over the additional S/D epitaxial growth, and chemical-mechanical polishing (CMP) takes place to remove the remaining hardmasks, in accordance with an embodiment of the present invention.

FIG. 11 is a cross-sectional view of the semiconductor structure of FIG. 10 where additional S/D epitaxial growth takes place around the thinned semiconductor layers, an ILD is deposited over the additional S/D epitaxial growth, and chemical-mechanical polishing (CMP) takes place to remove the remaining hardmasks, in accordance with an embodiment of the present invention.

In various example embodiments, additional S/D epitaxial growth 62 advantageously takes place around the thinned semiconductor materials (or layers) 26" and over the existing S/D epitaxial growths 52. This can be referred to as a cladded S/D epitaxy around uncut Si sheets (or thinned semiconductor layers 26"). An ILD 64 is then deposited over the cladded S/D epitaxial growth 62 and CMP is performed to remove the remaining hardmasks 38.

Figure 12:
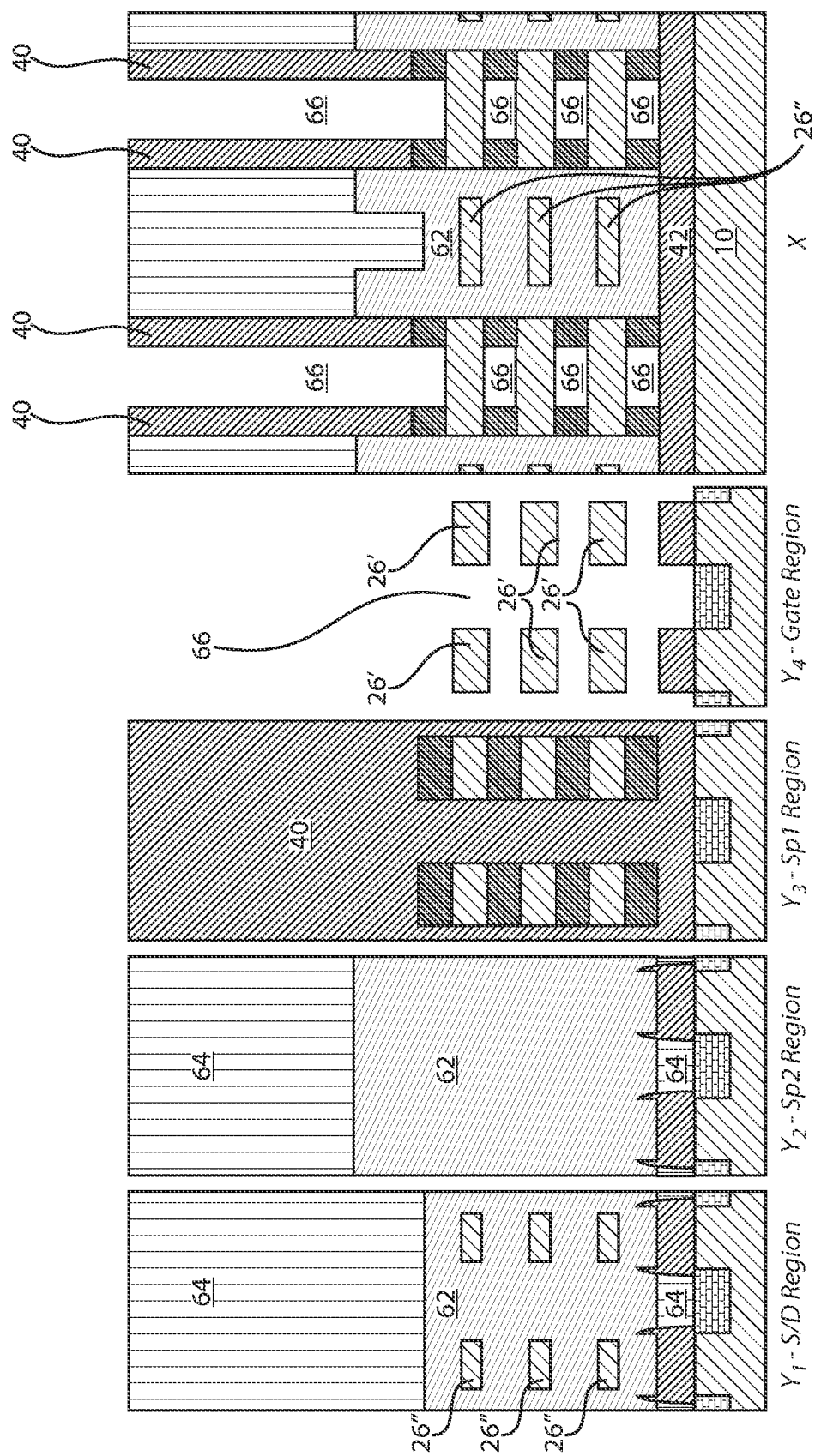
FIG. 12 is a cross-sectional view of the semiconductor structure of FIG. 11 where the sacrificial gate and gate dielectric layers are removed from the gate region to expose sections of the semiconductor layers of the fins in the gate region, in accordance with an embodiment of the present invention.

FIG. 12 is a cross-sectional view of the semiconductor structure of FIG. 11 where the sacrificial gate and gate dielectric layers are removed from the gate region to expose sections of the semiconductor layers of the fins in the gate region, in accordance with an embodiment of the present invention.

In various example embodiments, the sacrificial materials 36 and the sacrificial semiconductor layers 24' of the fins 20' are removed from the gate region, as well as in the X-direction to expose sections of the semiconductor layers 26' of the fins 20' in the gate region. The dielectric liner 34 is also selectively removed during this process. Gaps or openings 66 are created between the remaining semiconductor layers 26' in the gate region. The semiconductor layers 26' can also be referred to as second stacked semiconductor layers 26'.

Figure 13:
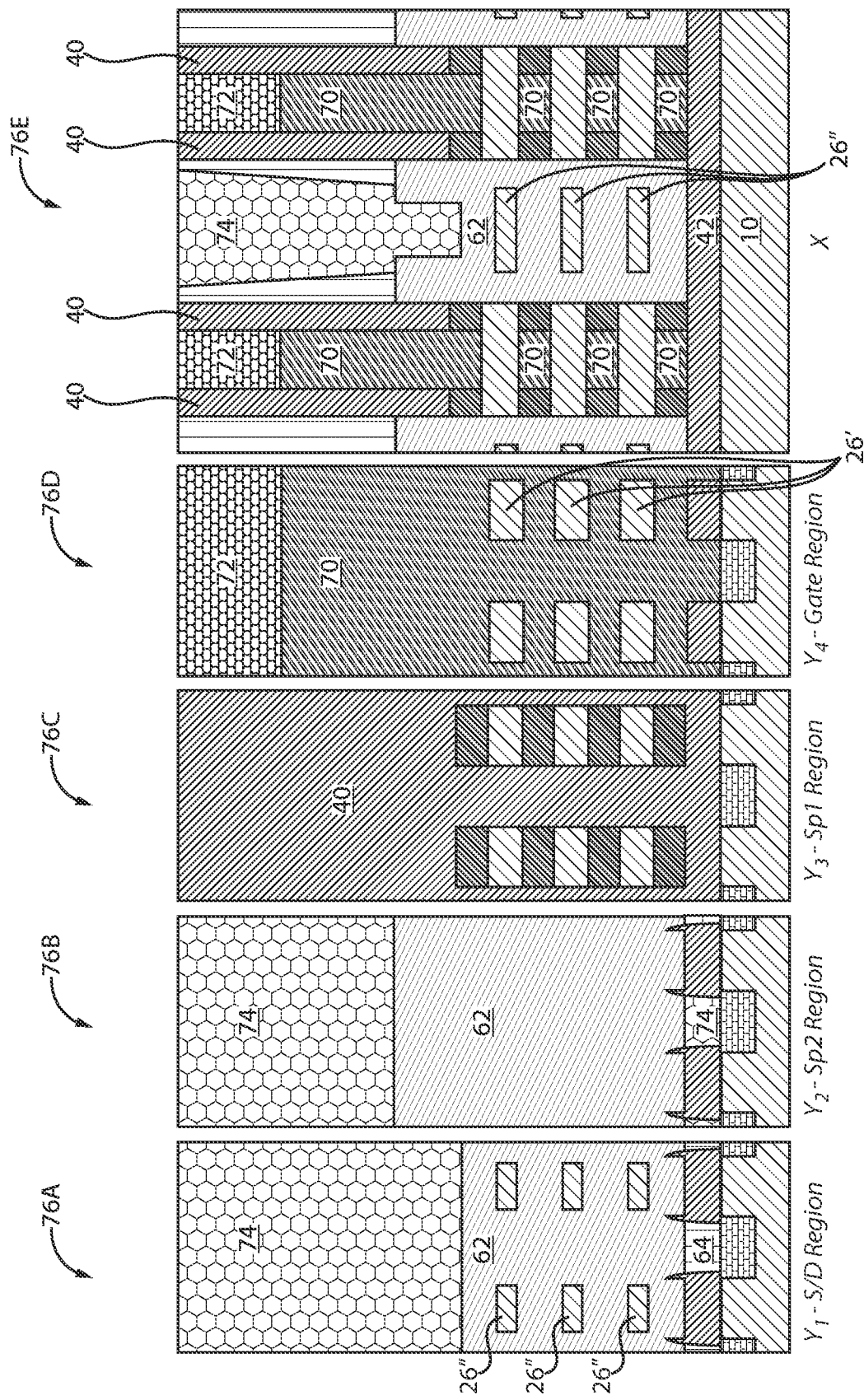
FIG. 13 is a cross-sectional view of the semiconductor structure of FIG. 12 where a high-k metal gate (HKMG), self-aligned contact (SAC) cap, and trench contacts are formed, in accordance with an embodiment of the present invention.

FIG. 13 is a cross-sectional view of the semiconductor structure of FIG. 12 where a high-k metal gate (HKMG), self-aligned contact (SAC) cap, and trench metal contacts are formed, in accordance with an embodiment of the present invention.

In various example embodiments, a high-k metal gate (HKMG) 70, a self-aligned contact (SAC) cap 72, and trench metal contacts 74 are formed. The SAC cap 72 is formed directly over the HKMG 70. The HKMG 70 is visible in the gate region. The HKMG 70 envelops or encapsulates or surrounds the semiconductor layers 26' in the gate region. The trench metal contacts 74 directly contact the cladded S/D epitaxial growth 62. The trench metal contacts 74 advantageously extend below a top surface of vertical portions defined by the cladded S/D epitaxial growth 62.

The first stacked semiconductor layers 26" are thus advantageously disposed within the cladded S/D epitaxial growth 62 in the S/D region, where the first stacked semiconductor layers 26" have a first thickness. The second stacked semiconductor layers 26' are advantageously disposed within the HKMG 70 in the gate region, where the second stacked semiconductor layers 26' have a second thickness.

The center axis of the first stacked semiconductor layers 26" in the S/D region are horizontally aligned with the center axis of the second stacked semiconductor layers 26' in the gate region. Additionally, the first stacked semiconductor layers 26" can be composed of a same material as the second stacked semiconductor layers 26'.

The cladded S/D epitaxial growth 62 advantageously defines vertical portions extending from the BDI regions 42 to above a top surface of the first stacked semiconductor layers 26" and the second stacked semiconductor layers 26'. The vertical portions of the cladded S/D epitaxial growth 62 advantageously connect the first stacked semiconductor layers 26" of the S/D region to the second stacked semiconductor layers 26' extending from the gate region to an inner spacer region.

It is noted that the cladded S/D epitaxial growth 62 completely surrounds the first stacked semiconductor layers 26" in the S/D region. It is further noted that the HKMG 70 completely surrounds the second stacked semiconductor layers 26' in the gate region.

In structure 76A, the trench metal contact 74 directly contacts the cladded S/D epitaxial growth 62 surrounding the thinned semiconductor layers 26".

In structure 76B, the trench metal contact 74 directly contacts the cladded S/D epitaxial growth 62, where no semiconductor layers are present.

In structure 76C, the first spacer 40 surrounds the inner spacers 50 and the alternating semiconductor layers 26'.

In structure 76D, the HKMG 70 surrounds the semiconductor layers 26' in the gate region.

In structure 76E, the trench contact 74 directly contacts the cladded S/D epitaxial growth 62 surrounding the thinned semiconductor layers 26". HKMG 70 surrounds the semiconductor layers 26'.

In various embodiments, the high-k materials of the HKMG 70 can include but are not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb($Sc_xTa_{1-x}$)$O_3$), and lead zinc niobate (e.g., $PbZn_{1/3}Nb_{2/3}O_3$).

The conductive material or trench contact 74, can be, e.g., cobalt (Co).

Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The conductive metal can be deposited by a suitable deposition process, for example, CVD, PECVD, PVD, plating, thermal or e-beam evaporation, and sputtering.

Figure 14:
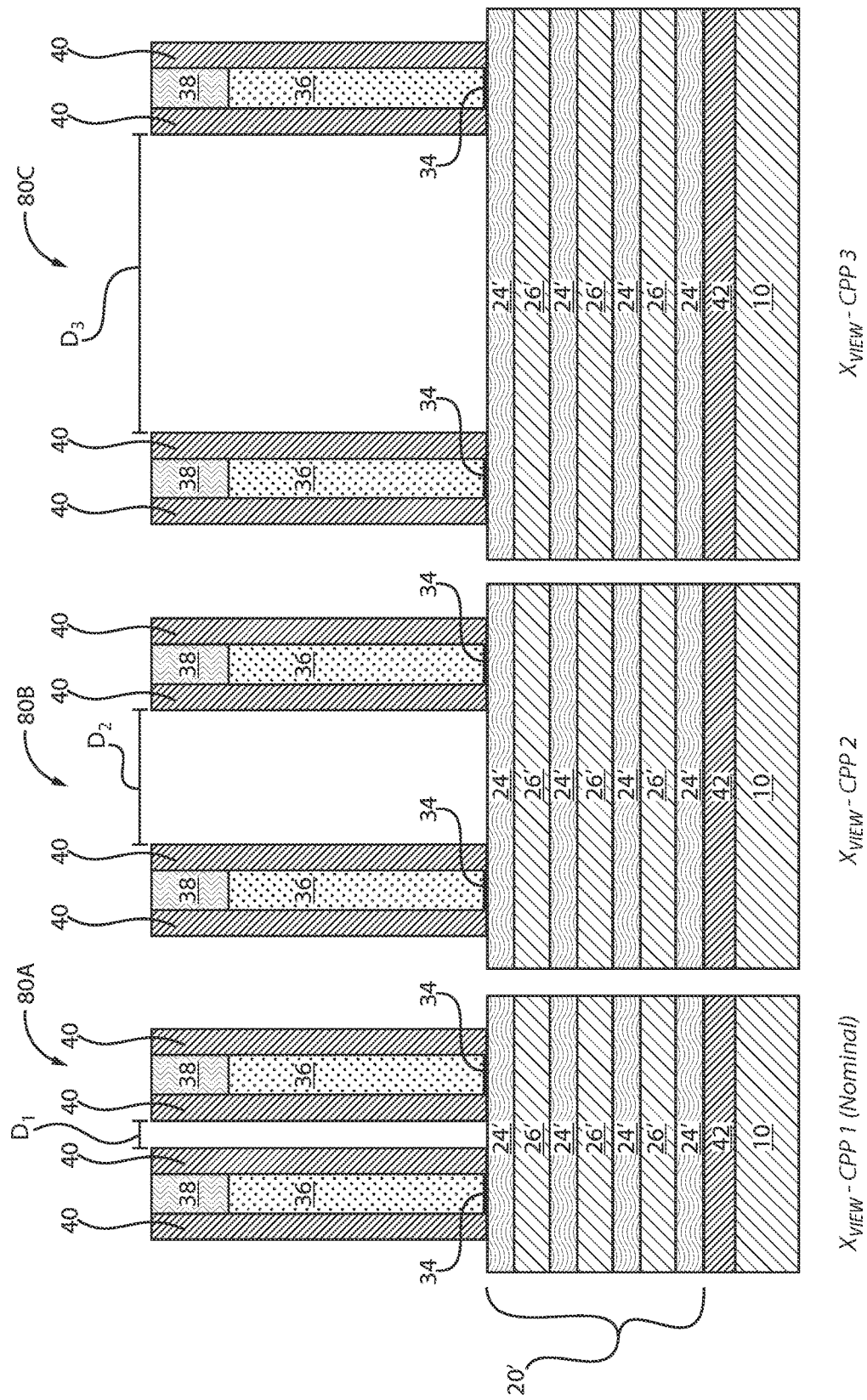
FIG. 14 is a cross-sectional view of the semiconductor structure of FIG. 5 in the X-direction for different contacted poly pitches (CPPs), in accordance with another embodiment of the present invention.

FIG. 14 is a cross-sectional view of the semiconductor structure of FIG. 5 in the X-direction for different contacted poly pitches (CPPs), in accordance with another embodiment of the present invention.

In various example embodiments, the fin 20' is formed over the BDI regions 42, which in turn is formed over the substrate 10. The fin 20' includes alternating semiconductor materials (or layers) 24'/26'. The first semiconductor material 24' can be, e.g., silicon germanium (SiGe) with a 25% concentration of SiGe and the second semiconductor material 26' can be, e.g., silicon (Si). The dielectric liner 34, the sacrificial material 36, and the hardmask 38 are formed over the fin 20'. The first spacers 40 are formed on opposed ends of the sacrificial material 36. The hardmask 38 is formed over the sacrificial material 36. The first spacers 40 directly contact sidewalls of the hardmask 38.

In structure 80A, the CPP is 42 nm resulting in spacing $D_1$ between the first spacers 40.

In structure 80B, the CPP is 100 nm resulting in spacing $D_2$ between the first spacers 40.

In structure 80C, the CPP is 200 nm resulting in spacing $D_3$ between the first spacers 40.

Therefore, a $1^{st}$ region on the wafer with adjacent devices exhibits a $1^{st}$ CPP with gate-to-gate space "a." A $2^{nd}$ region on the wafer with adjacent devices exhibits a $2^{nd}$ CPP with gate-to-gate space "b." Adjacent devices with the $1^{st}$ CPP exhibit a smaller gate-to-gate canyon than adjacent devices with the $2^{nd}$ CPP such that "a<b." Adjacent devices with the $1^{st}$ CPP exhibit a S/D epitaxy region without semiconductor layers disposed within the S/D. Adjacent devices with the $2^{nd}$ CPP exhibit a S/D epitaxy region with semiconductor layers disposed within the S/D. For adjacent devices with the $2^{nd}$ CPP, the horizontal space separating the edge of semiconductor layers in the S/D epitaxy region and the edge of semiconductor layers in the device region is equal to the gate-to-gate space "a" in the $1^{st}$ CPP region.

Figure 15:
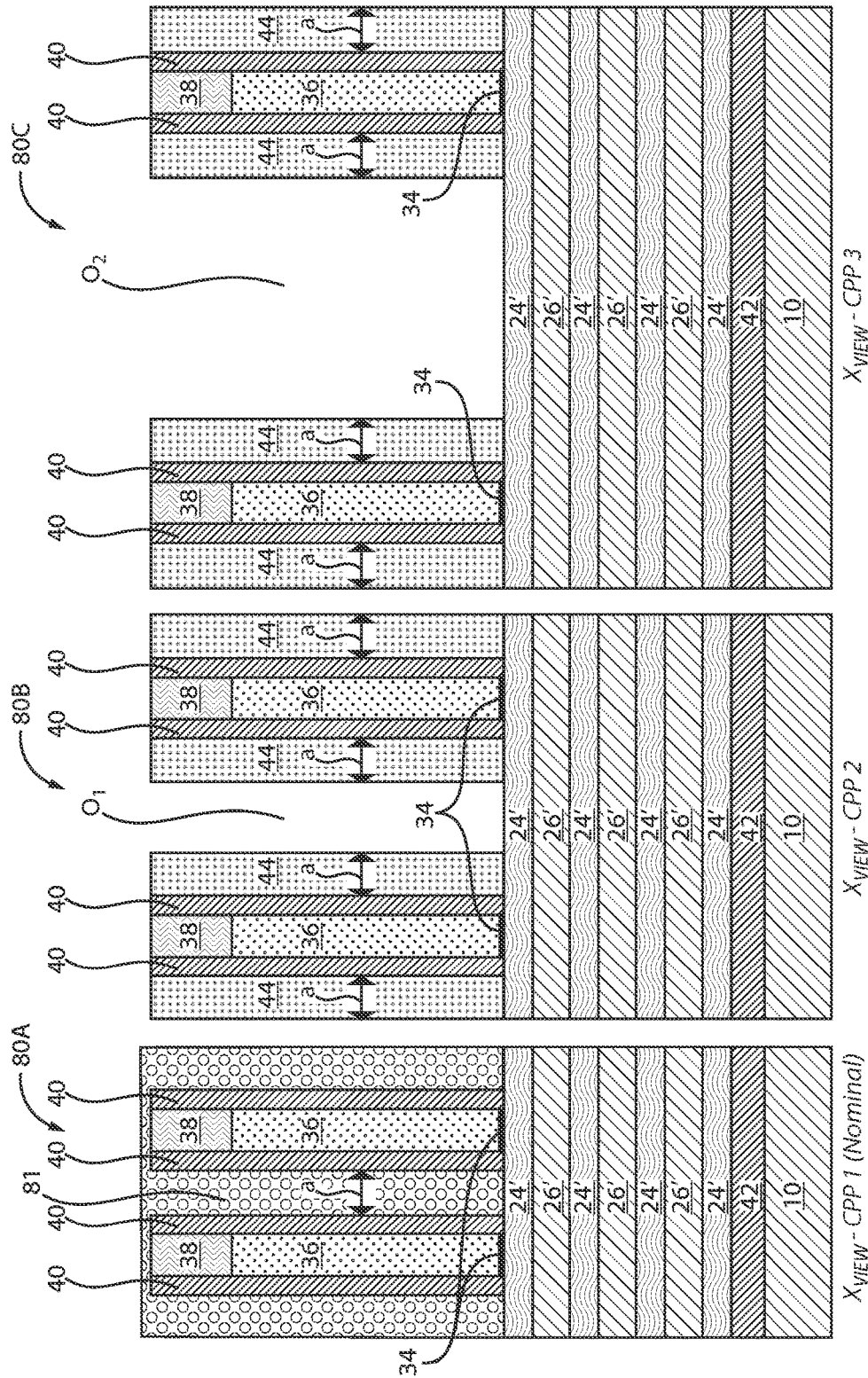
FIG. 15 is a cross-sectional view of the semiconductor structure of FIG. 14 where an organic planarization layer (OPL) is deposited in structure 80A, and the second spacer is deposited in structures 80B, 80C, in accordance with an embodiment of the present invention.

FIG. 15 is a cross-sectional view of the semiconductor structure of FIG. 14 where an organic planarization layer (OPL) is deposited in structure 80A, and the second spacer is deposited in structures 80B, 80C, in accordance with an embodiment of the present invention.

In various example embodiments, in structure 80A, an OPL 81 is deposited.

In structures 80B, 80C, the second spacer 44 is deposited.

An opening O1 is formed in structure 80B and an opening O2 is formed in structure 80C.

Figure 16:
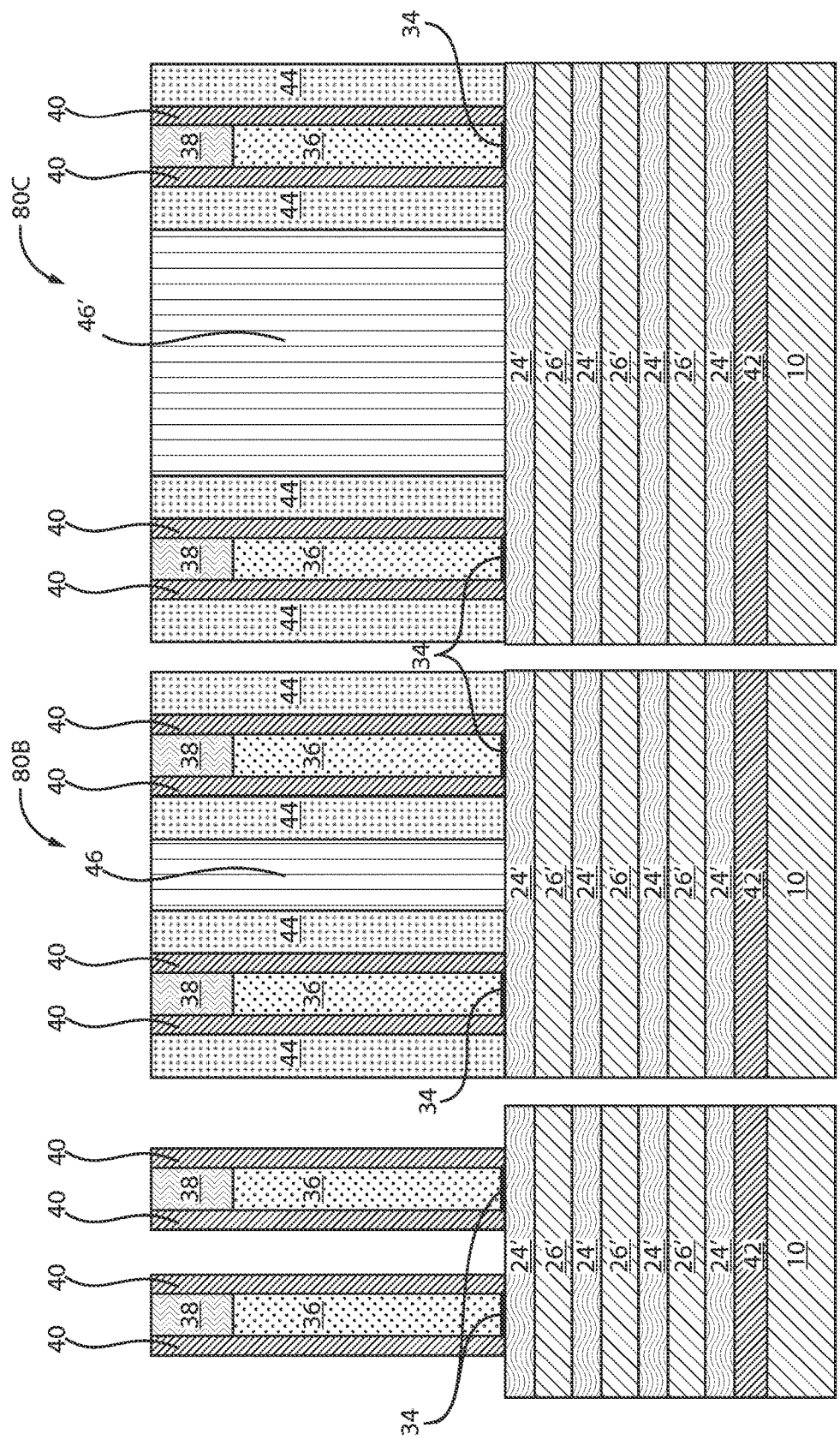
FIG. 16 is a cross-sectional view of the semiconductor structure of FIG. 15 where an ILD is deposited in structures 80B, 80C and the OPL is removed, in accordance with an embodiment of the present invention.

FIG. 16 is a cross-sectional view of the semiconductor structure of FIG. 15 where an ILD is deposited in structures 80B, 80C and the OPL is removed, in accordance with an embodiment of the present invention.

In various example embodiments, an ILD is deposited such that the ILD 46 is formed in opening O1 in structure 80B and an ILD 46' is formed in opening O2 in structure 80C. The OPL 81 is then selectively removed from structure 80A. The OPL 81 can be removed by e.g., ashing.

Figure 17:
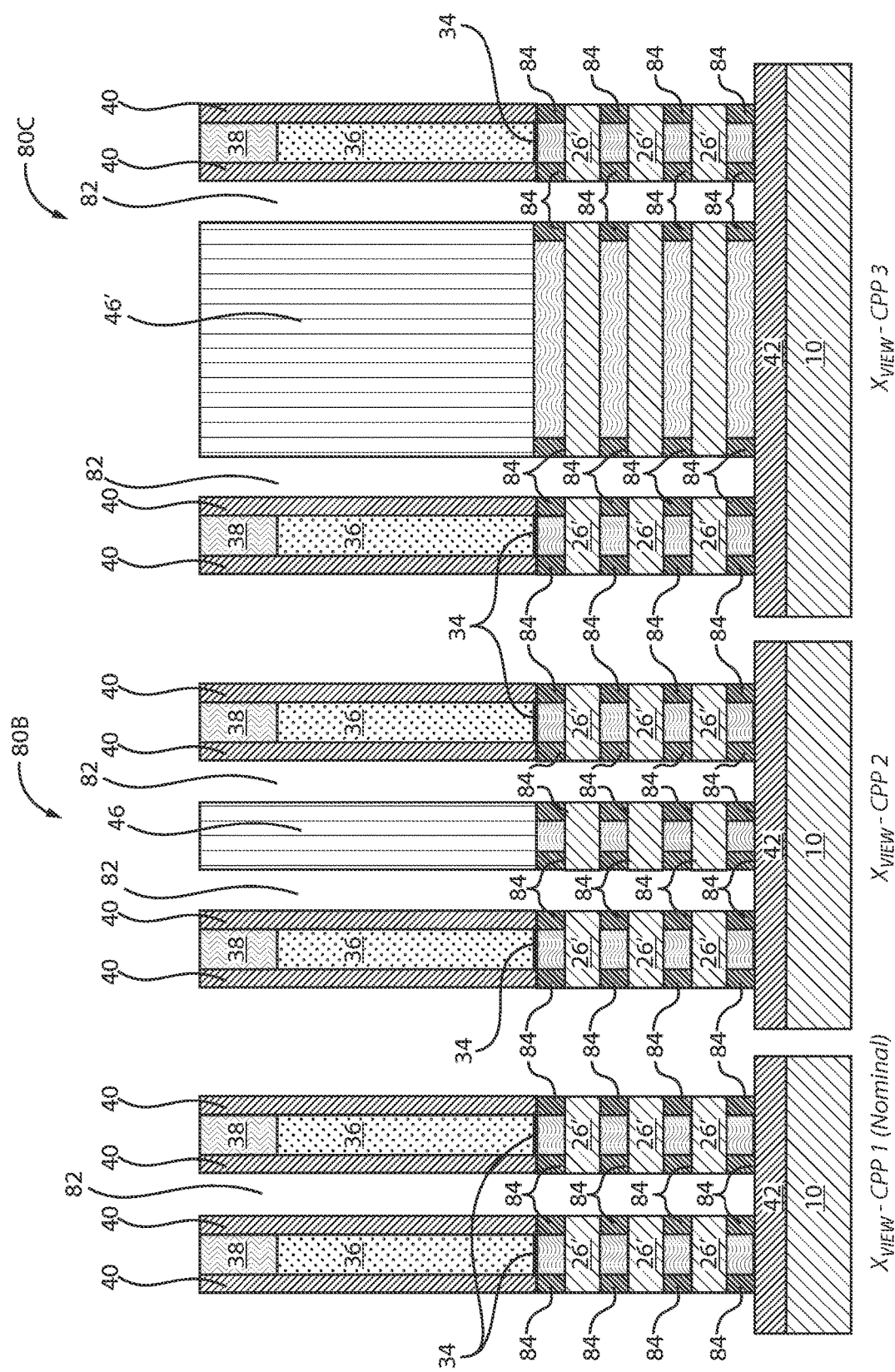
FIG. 17 is a cross-sectional view of the semiconductor structure of FIG. 16 where the second spacer is selectively removed, the fins are recessed, and inner spacers are formed, in accordance with an embodiment of the present invention.

FIG. 17 is a cross-sectional view of the semiconductor structure of FIG. 16 where the second spacer is selectively removed, the fins are recessed, and inner spacers are formed, in accordance with an embodiment of the present invention.

In various example embodiments, the second spacer 44 is selectively removed, the fins are recessed to create openings 82, and inner spacers 84 are formed. The ILD 46 and the ILD 46' remain in structures 80B, 80C, respectively.

Any etching technique known in the art can be used for the recessing. In one example, reactive ion etching (RIE) is performed.

Figure 18:
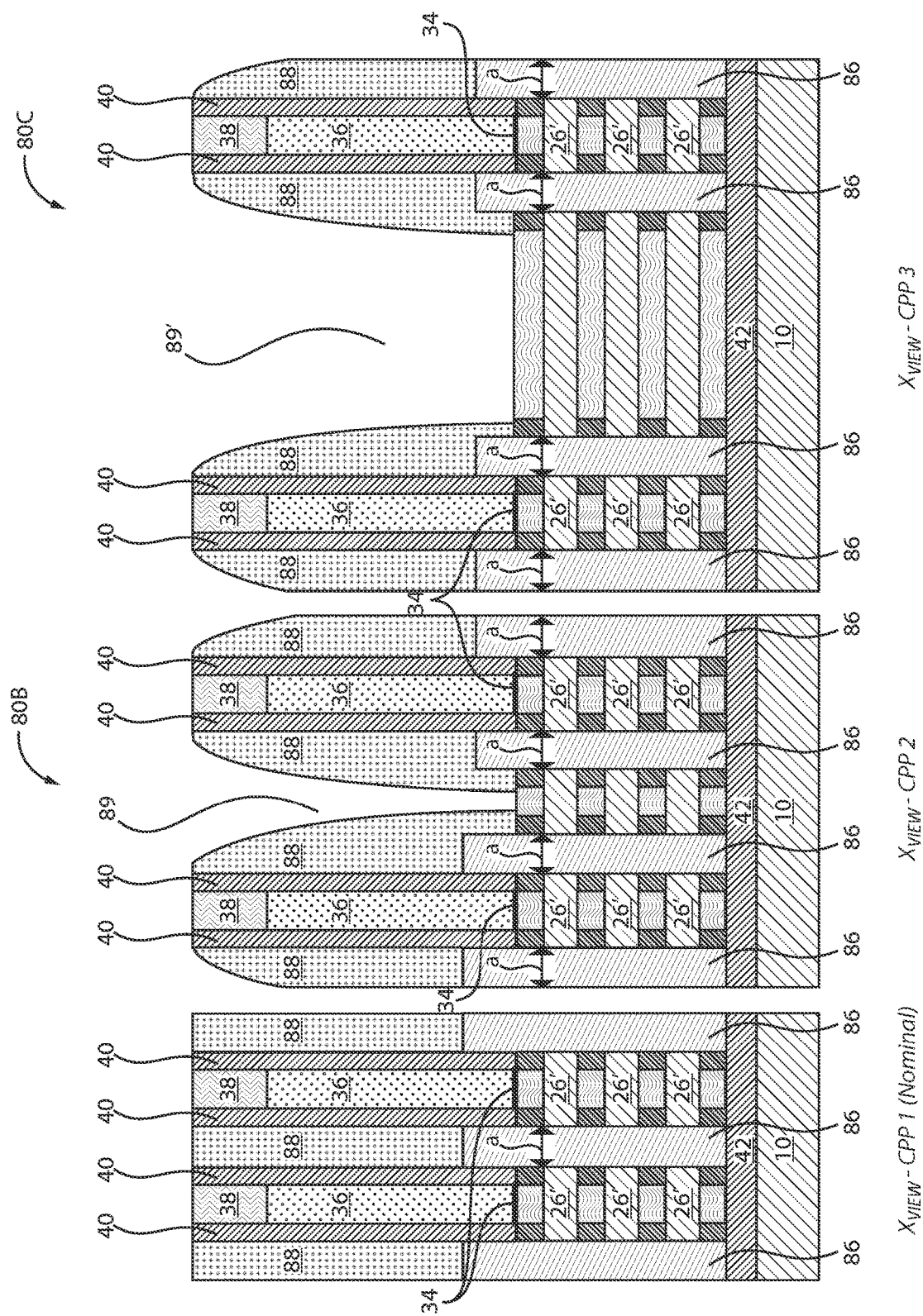
FIG. 18 is a cross-sectional view of the semiconductor structure of FIG. 17 where S/D epitaxial growth takes place between the fins, the ILDs are removed, and the third spacers are formed over the S/D epitaxial growth, in accordance with an embodiment of the present invention.

FIG. 18 is a cross-sectional view of the semiconductor structure of FIG. 17 where S/D epitaxial growth takes place between the fins, the ILDs are removed, and the third spacers are formed over the S/D epitaxial growth, in accordance with an embodiment of the present invention.

In various example embodiments, a S/D epitaxial growth 86 takes place between the fins, the ILDs 46, 46' are selectively removed, and the third spacers 88 are formed over the S/D epitaxial growth 86. The third spacers 88 directly contact the top portions of the S/D epitaxial growths 86. The S/D epitaxial growths 86 have an equal width designed by "a."

In structure 80B, an opening 89 is defined, whereas in structure 80C, an opening 89' is defined. Opening 89' is greater than opening 89.

Figure 19:
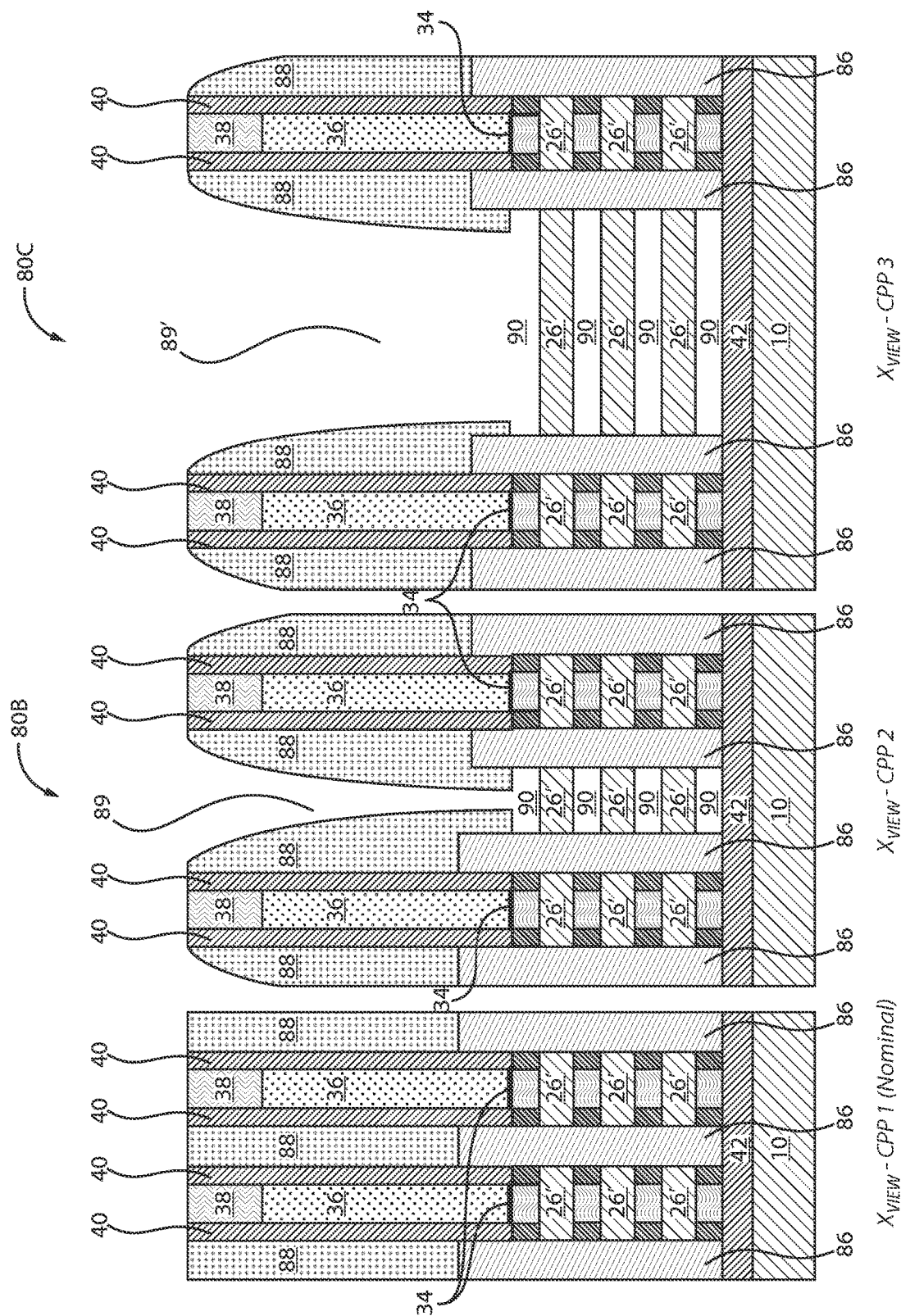
FIG. 19 is a cross-sectional view of the semiconductor structure of FIG. 18 where sacrificial layers of the nanosheet stack are selectively removed in structures 80B, 80C to create gaps between the semiconductor layers of the fins, and the inner spacers are removed after selectively removing the sacrificial layers, in accordance with an embodiment of the present invention.

FIG. 19 is a cross-sectional view of the semiconductor structure of FIG. 18 where sacrificial layers of the nanosheet stack are selectively removed in structures 80B, 80C to create gaps between the semiconductor layers of the nanosheet stack, and the inner spacers are removed after selectively removing the sacrificial layers, in accordance with an embodiment of the present invention.

In various example embodiments, the sacrificial layers of the nanosheet stack are selectively removed in structures 80B, 80C to create gaps 90 between the semiconductor materials (or layers) 26' of the fins. Additionally, the inner spacers 84 formed on fins within the openings 89, 89' are selectively removed. As a result, only the semiconductor layers 26' of the fins remain within the openings 89, 89'.

Figure 20:
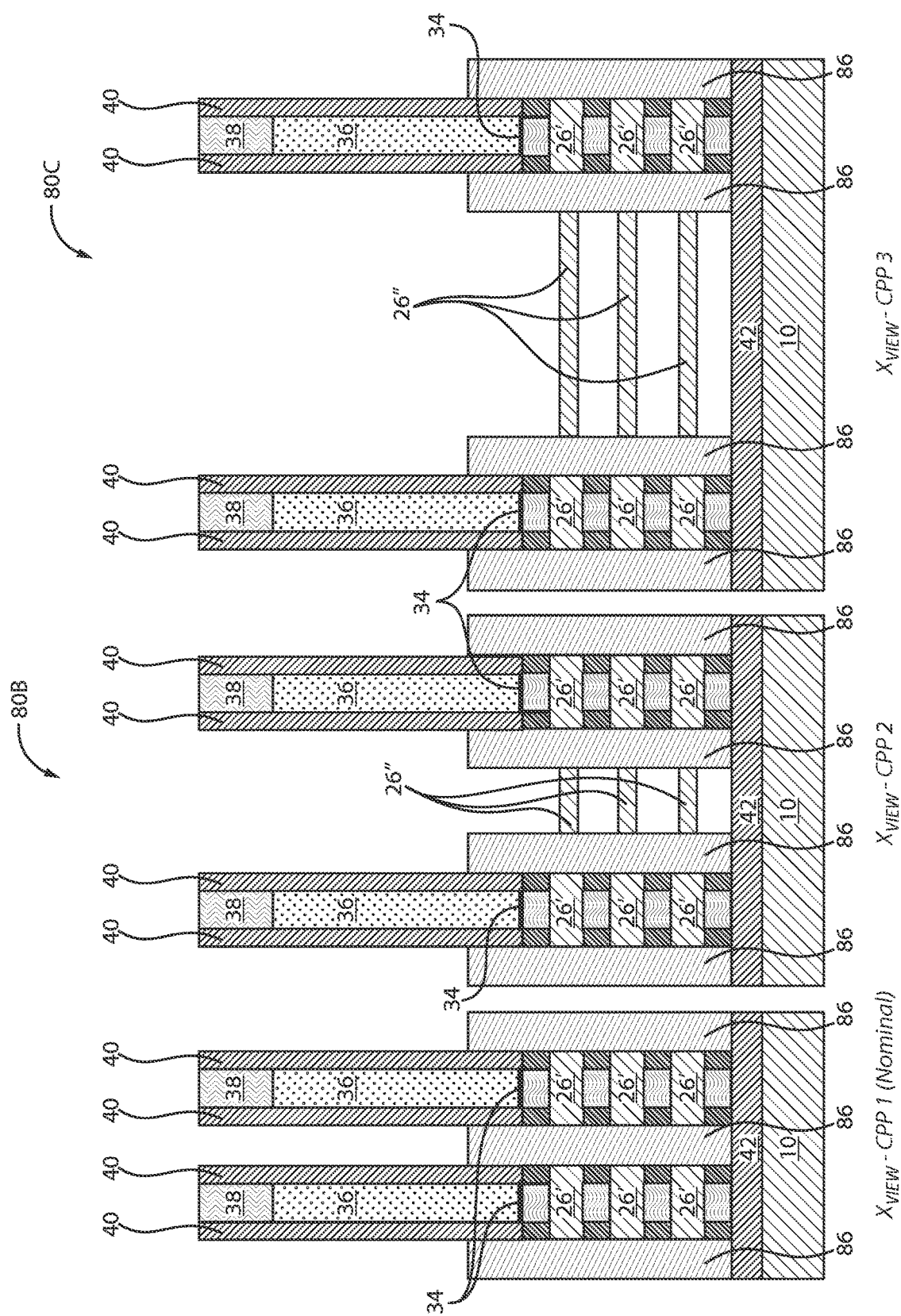
FIG. 20 is a cross-sectional view of the semiconductor structure of FIG. 19 where the semiconductor layers of the fins are optionally thinned and the third spacer is selectively removed, in accordance with an embodiment of the present invention.

FIG. 20 is a cross-sectional view of the semiconductor structure of FIG. 19 where the semiconductor layers of the fins are optionally thinned and the third spacer is selectively removed, in accordance with an embodiment of the present invention.

In various example embodiments, in structures 80B, 80C, the semiconductor layers 26' of the fins are optionally thinned to create thinned semiconductor layers 26" and the third spacers 88 are selectively removed to expose the S/D epitaxial growths 86.

Figure 21:
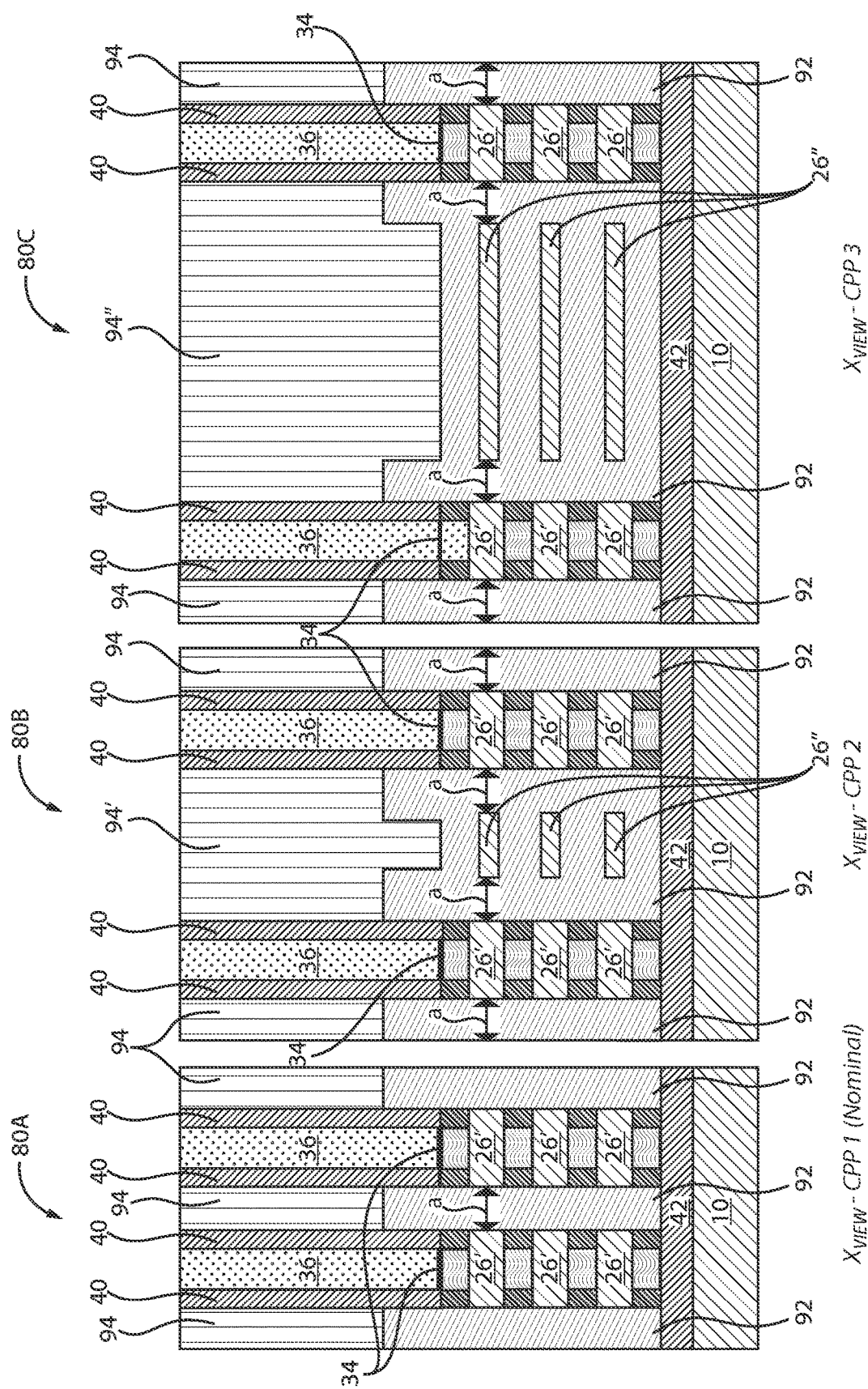
FIG. 21 is a cross-sectional view of the semiconductor structure of FIG. 20 where additional S/D epitaxial growth takes place around the thinned semiconductor layers, an ILD is deposited over the additional S/D epitaxial growth, and chemical-mechanical polishing (CMP) takes place to remove the remaining hardmasks, in accordance with an embodiment of the present invention.

FIG. 21 is a cross-sectional view of the semiconductor structure of FIG. 20 where additional S/D epitaxial growth takes place around the thinned semiconductor layers, an ILD is deposited over the additional S/D epitaxial growth, and chemical-mechanical polishing (CMP) takes place to remove the remaining hardmasks, in accordance with an embodiment of the present invention.

In various example embodiments, additional S/D epitaxial growth 92 advantageously takes place around the thinned semiconductor layers 26" and over the existing S/D epitaxial growths 86. This can be referred to as a cladded S/D epitaxy around uncut Si sheets (or thinned semiconductor layers 26"). The ILD 94, 94', 94" is then deposited over the cladded S/D epitaxial growths 92 and CMP is performed to remove the remaining hardmasks 38. The ILD 94 is present in structure 80A, the ILD 94' is present between the fins 20' in structure 80B, and the ILD 94" is present between the fins 20' in structure 80C. The cladded S/D epitaxial growths 92 have vertical portions with an equal width designed by "a."

Figure 22:
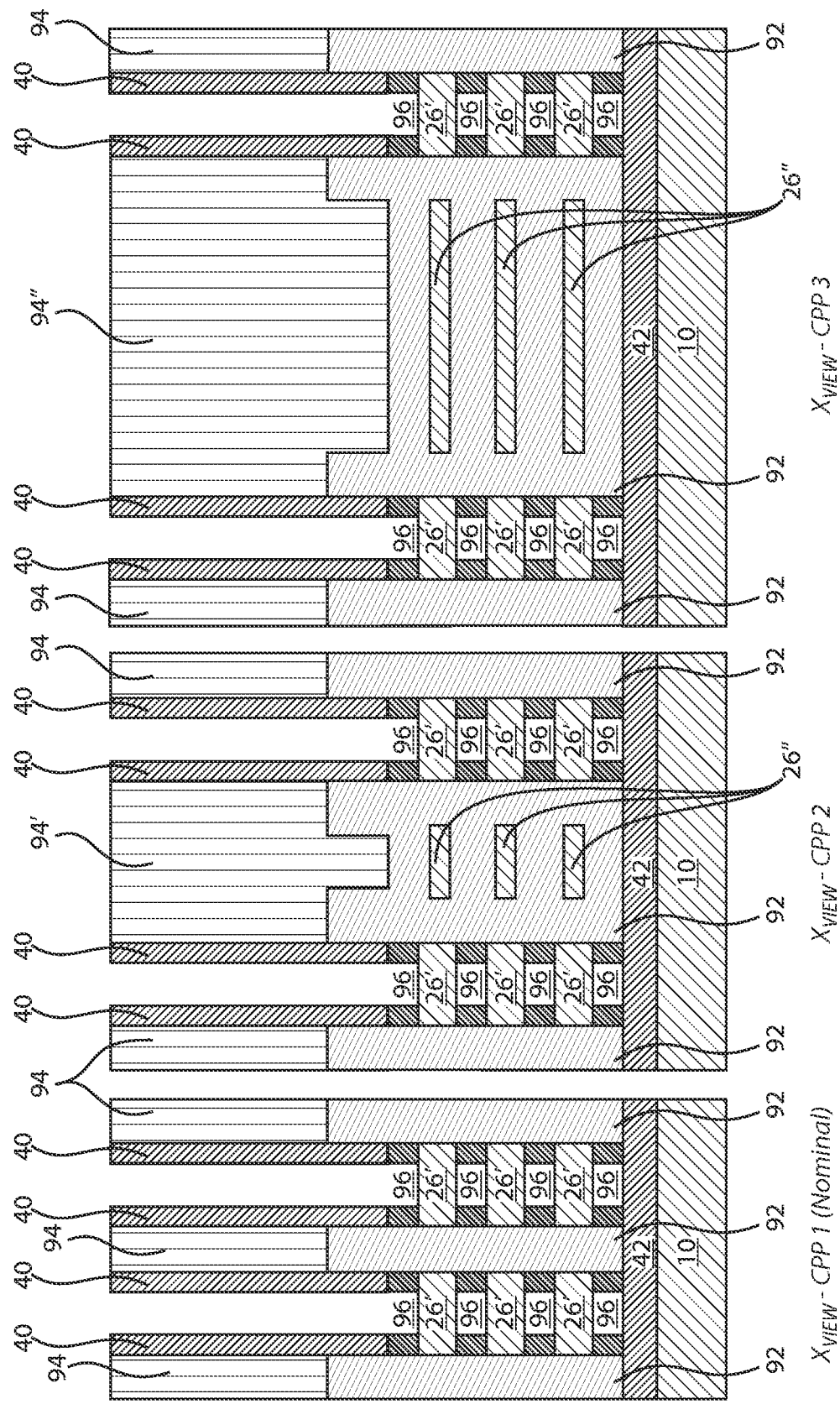
FIG. 22 is a cross-sectional view of the semiconductor structure of FIG. 21 where the remaining sacrificial gate, gate dielectric layers and sacrificial semiconductor layers are removed, in accordance with an embodiment of the present invention.

FIG. 22 is a cross-sectional view of the semiconductor structure of FIG. 21 where the remaining sacrificial gate, gate dielectric layers and sacrificial semiconductor layers are removed, in accordance with an embodiment of the present invention.

In various example embodiments, the sacrificial materials 36 and the sacrificial semiconductor layers 24' of the fins 20' are removed to expose sections of the semiconductor layers 26' of the fins. The dielectric liner 34 is also selectively removed during this process. Gaps or openings 96 are created between the remaining semiconductor layers 26'.

Figure 23:
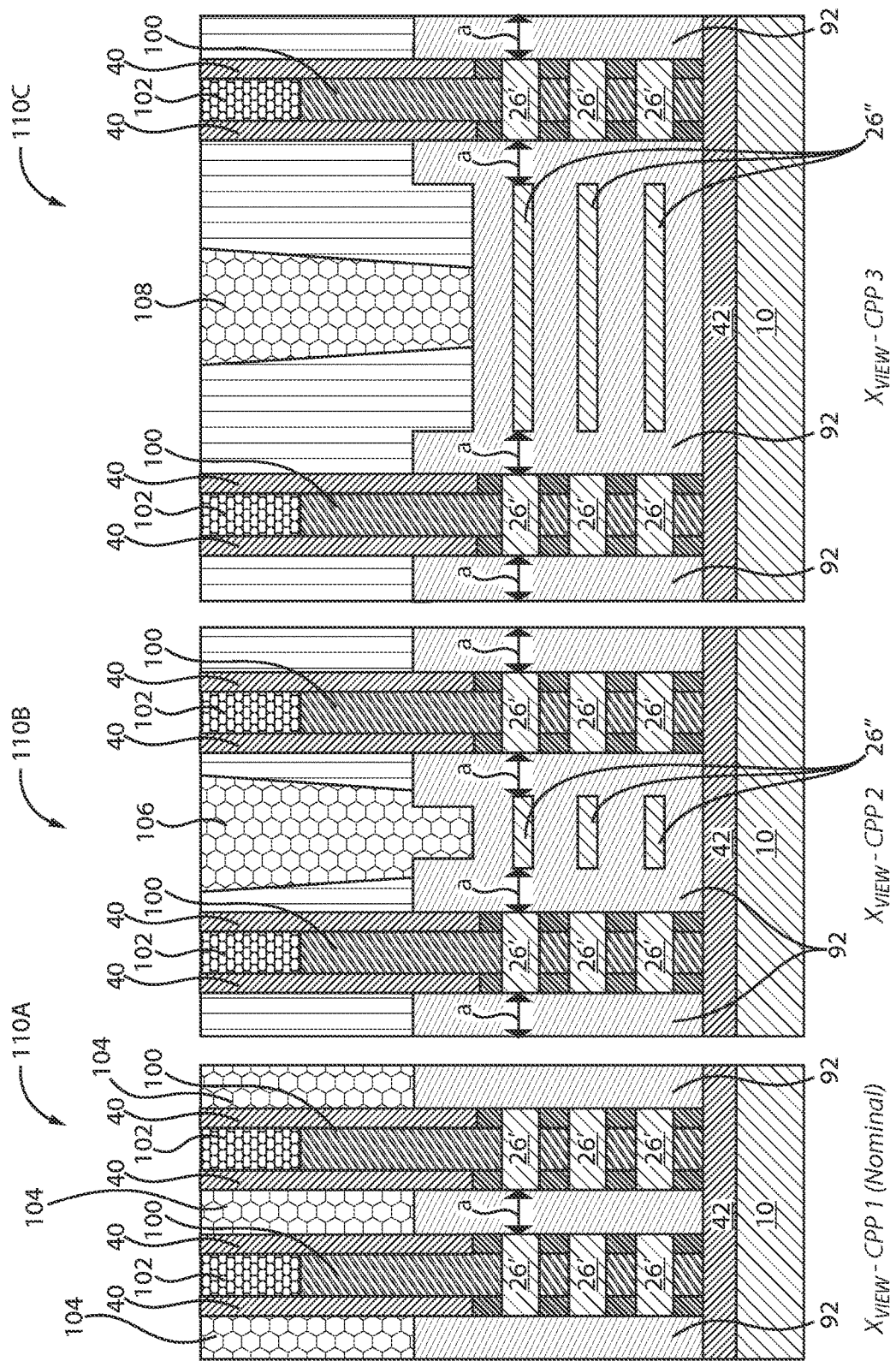
FIG. 23 is a cross-sectional view of the semiconductor structure of FIG. 22 where a high-k metal gate (HKMG) self-aligned contact (SAC) cap, and trench contacts are formed, in accordance with an embodiment of the present invention.

FIG. 23 is a cross-sectional view of the semiconductor structure of FIG. 22 where a high-k metal gate (HKMG) self-aligned contact (SAC) cap, and trench contacts are formed, in accordance with an embodiment of the present invention.

In various example embodiments, a high-k metal gate (HKMG) 100, self-aligned contact (SAC) cap 102, and trench metal contacts 104, 106, 108 are formed. The SAC cap 102 is formed directly over the HKMG 100. The HKMG 100 surrounds the semiconductor layers 26'. The trench metal contacts 104, 106, 108 directly contact the cladded S/D epitaxial growths 92. The cladded S/D epitaxial growths 92 have vertical portions with an equal width designed by "a."

In structure 110A, the trench metal contacts 104 directly contact the cladded S/D epitaxial growths 92 and sidewalls of the first spacer 40.

In structure 110B, the trench metal contact 106 directly contacts the cladded S/D epitaxial growth 92 and sidewalls of the ILD 94'. The trench metal contact 106 does not contact the first spacers 40.

In structure 110C, the trench metal contact 108 directly contacts the cladded S/D epitaxial growth 92 and sidewalls of the ILD 94". The trench metal contact 108 does not contact the first spacers 40.

Therefore, structures 110A, 110B, 110C can advantageously exhibit multi-CPP integration on the same chip where the canyon space between the stacked mandrels in the S/D region and the stacked channels in the gate region are equal to the smallest gate-to-gate space design on the chip for any CPP, which is beneficial for GAA semiconductor processing.

In conclusion, the exemplary embodiments of the present invention present a method and structure for advantageously achieving CPP-agnostic S/D contact formation for GAA devices with bottom dielectric isolation including stacked mandrels in the S/D region which are horizontally aligned with the stacked channels in the gate region. The stacked mandrels in the S/D region and the stacked channels in the gate region may beneficially be composed of the same material. Full bottom dielectric isolation in the gate region and S/D region is advantageously achieved, and a vertical S/D epitaxy extending from the bottom dielectric isolation to above the top-most mandrel and connecting the stacked mandrels in the S/D region and the stacked channels in the gate region are presented. A cladded S/D epitaxy around the stacked mandrels in the S/D regions is further advantageously achieved to connect the vertical S/D epitaxy in between the stacked mandrels in the S/D region and the stacked channels in the gate region.

Moreover, the exemplary embodiments of the present invention provide for an improvement of the Si surface available for S/D epi nucleation. In other words, the uncut sheets (of Si) in the S/D region allow to nucleate large volumes of crystalline epi. Moreover, the exemplary embodiments of the present invention advantageously enable to reliably land trench metal contacts on merged epi in large gate canyon spaces. The exemplary methods of the present invention further advantageously enable to simulate a constant canyon space design for any CPP and any gate length by using simple spacers. This provides for an improvement in preventing bottom dielectric isolation punch-through during the S/D recess. Also, in wide canyons with the substrate covered by BDI or a BOX (SOI case), the S/D epitaxy cannot nucleate in the center of the canyons since the substrate is not exposed. This leads to epitaxy forming only on the sidewalls of the adjacent device which can make it impossible to land a trench contact on the S/D epi. Adding these Si mandrels in the S/D region above the BDI or BOX (SOI case) advantageously enables to ensure a nucleation point in the wide gate-to-gate space for a merged S/D epitaxy to be formed.

Regarding FIGS. 1-23, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and structure pertaining to CPP-agnostic S/D contact formation for GAA devices with bottom dielectric isolation (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
source/drain (S/D) epitaxial growth formed over a bottom dielectric isolation (BDI) region;
at least one first semiconductor layer disposed within the S/D epitaxial growth in a S/D region, the at least one first semiconductor layer being an inactive channel;
at least one second semiconductor layer disposed partially within a gate region, the at least one second semiconductor layer being an active channel, and wherein the at least one second semiconductor layer extends from the gate region into a spacer region to enable a connection to the S/D epitaxial growth;
a first region with adjacent devices exhibiting a first Contacted gate Poly Pitch (CPP) defining a first gate-to-gate space, and
a second region with adjacent devices exhibiting a second CPP defining a second gate-to-gate space, where adjacent devices exhibiting the first CPP have a smaller gate-to-gate canyon than the adjacent devices exhibiting the second CPP such that the second gate-to-gate space is greater than the first gate-to-gate space.

2. The semiconductor structure of claim 1, wherein a center axis of the at least one first semiconductor layer in the S/D region is horizontally aligned with a center axis of the at least one second semiconductor layer extending from the gate region to the spacer region.

3. The semiconductor structure of claim 1, wherein the at least one first semiconductor layer is composed of a same material as the at least one second semiconductor layer.

4. The semiconductor structure of claim 1, wherein the S/D epitaxial growth defines vertical portions extending from the BDI region to above a top surface of the at least one first semiconductor layer and the at least one second semiconductor layer.

5. The semiconductor structure of claim 4, wherein the vertical portions of the S/D epitaxial growth connect the at least one first semiconductor layer of the S/D region to the at least one second semiconductor layer extending from the gate region to the spacer region.

6. The semiconductor structure of claim 1, wherein the S/D epitaxial growth completely surrounds the at least one first semiconductor layer.

7. The semiconductor structure of claim 1, wherein the adjacent devices in the first region exhibiting the first CPP have the S/D region without the at least one first semiconductor layer disposed within a S/D; and wherein the adjacent devices in the second region exhibiting the second CPP have the S/D region with the at least one second semiconductor layer disposed within the S/D.

8. The semiconductor structure of claim 1, wherein metal contacts extend below a top surface of vertical portions defined by the S/D epitaxial growth.

9. A semiconductor structure comprising:
a bottom dielectric isolation (BDI) region disposed in direct contact with a substrate;
source/drain (S/D)) epitaxial growth including vertical portions disposed over the BDI region;
at least one first semiconductor layer disposed within the S/D epitaxial growth in a S/D region;
at least one second semiconductor layer disposed partially within a gate region, wherein the at least one second semiconductor layer extends from the gate region into a spacer region to enable a connection to the S/D epitaxial growth;
a first region with adjacent devices exhibiting a first Contacted gate Poly Pitch (CPP) defining a first gate-to-gate space; and
a second region with adjacent devices exhibiting a second CPP defining a second gate-to-gate space, where adjacent devices exhibiting the first CPP have a smaller gate-to-gate canyon than the adjacent devices exhibiting the second CPP such that the second gate-to-gate space is greater than the first gate-to-gate space.

10. The semiconductor structure of claim 9, wherein a center axis of the at least one first semiconductor layer in the S/D region is horizontally aligned with a center axis of the at least one second semiconductor layer extending from the gate region to the spacer region.

11. The semiconductor structure of claim 9, wherein the at least one first semiconductor layer is composed of a same material as the at least one second semiconductor layer.

12. The semiconductor structure of claim 9, wherein the S/D epitaxial growth defines vertical portions extending from the BDI region to above a top surface of the at least one first semiconductor layer and the at least one second semiconductor layer.

13. The semiconductor structure of claim 9, wherein the vertical portions of the S/D epitaxial growth connect the at least one first semiconductor layer of the S/D region to the at least one second semiconductor layer extending from the gate region to the spacer region.

14. The semiconductor structure of claim 9, wherein the S/D epitaxial growth completely surrounds the at least one first semiconductor layer.

15. The semiconductor structure of claim 9, wherein the adjacent devices in the first region exhibiting the first CPP have the S/D region without the at least one first semiconductor layer disposed within a S/D; and wherein the adjacent devices in the second region exhibiting the second CPP have the S/D region with the at least one second semiconductor layer disposed within the S/D.

16. The semiconductor structure of claim 9, wherein metal contacts extend below a top surface of the vertical portions of the S/D epitaxial growth.

17. A method comprising:
forming fins over a substrate, the fins including alternating layers of a first semiconductor material and a second semiconductor material;
forming a sacrificial dielectric over the fins in a gate region;
forming sacrificial gates;
constructing a bottom dielectric isolation (BDI) region directly between the fins and the substrate;
forming a first spacer;
depositing an interlayer dielectric (ILD) in a source/drain (S/D) region;

selectively etching the first spacer;
recessing the fins and forming inner spacers; forming source/drain (S/D) epitaxial growth;
forming a second spacer over and in direct contact with the S/D epitaxial growth;
etching the first semiconductor material of the fins in the S/D region and selectively removing the inner spacers formed in the S/D region;
selectively etching the second spacer to expose a top surface of the S/D epitaxial growth; and
forming cladded S/D epitaxy in the S/D region such that the cladded S/D epitaxy surrounds the second semiconductor material of the fins.

18. The method of claim 17, further comprising thinning the second semiconductor material of the fins in the S/D region before forming the cladded S/D epitaxy.

19. The method of claim 17, further comprising: removing the sacrificial dielectric in the gate region; and forming a high-k metal gate (HKMG) around the second semiconductor material of the fins in the gate region.

20. The method of claim 17, wherein the S/D epitaxial growth defines vertical portions extending from the BDI region to above a top surface of the second semiconductor material of the fins.

* * * * *